United States Patent
Huh et al.

(10) Patent No.: US 11,997,926 B2
(45) Date of Patent: May 28, 2024

(54) HETEROCYCLIC COMPOUND AND ORGANIC LIGHT EMITTING ELEMENT COMPRISING SAME

(71) Applicant: LG CHEM, LTD., Seoul (KR)

(72) Inventors: Jungoh Huh, Daejeon (KR); Miyeon Han, Daejeon (KR); Dong Hoon Lee, Daejeon (KR); Dong Uk Heo, Daejeon (KR); Jae Tak Lee, Daejeon (KR); Junghoon Yang, Daejeon (KR); Heekyung Yun, Daejeon (KR)

(73) Assignee: LG CHEM, LTD., Seoul (KR)

( * ) Notice: Subject to any disclaimer, the term of this patent is extended or adjusted under 35 U.S.C. 154(b) by 211 days.

(21) Appl. No.: 16/761,033

(22) PCT Filed: Oct. 30, 2018

(86) PCT No.: PCT/KR2018/012970
§ 371 (c)(1),
(2) Date: May 1, 2020

(87) PCT Pub. No.: WO2019/151615
PCT Pub. Date: Aug. 8, 2019

(65) Prior Publication Data
US 2020/0303661 A1 Sep. 24, 2020

(30) Foreign Application Priority Data
Feb. 2, 2018 (KR) .................. 10-2018-0013363

(51) Int. Cl.
*H10K 85/60* (2023.01)
*C07F 9/6561* (2006.01)
(Continued)

(52) U.S. Cl.
CPC ....... *H10K 85/6572* (2023.02); *C07F 9/6561* (2013.01); *C09K 11/06* (2013.01);
(Continued)

(58) Field of Classification Search
CPC ............. H01L 51/0072; H01L 51/0067; H01L 51/0052; H01L 51/0054; H01L 51/5072;
(Continued)

(56) References Cited

U.S. PATENT DOCUMENTS

2004/0251816 A1 12/2004 Leo et al.
2014/0048792 A1 2/2014 Chun et al.
(Continued)

FOREIGN PATENT DOCUMENTS

| CN | 103597053 A | 2/2014 |
| CN | 107534091 A | 1/2018 |

(Continued)

OTHER PUBLICATIONS

Yuan et al., "Synthesis of novel host material based on cyclized diphenyl ether/phosphine oxide and its application in highly efficient phosphorescent organic light-emitting diodes," Scientia Sinica Chimica 43(4): 1-4 and 465-471 (2013), [English Language Machine Translation and original document in Chinese included].

(Continued)

*Primary Examiner* — Aaron J Gray
(74) *Attorney, Agent, or Firm* — BRYAN CAVE LEIGHTON PAISNER LLP

(57) ABSTRACT

Provided is a heterocyclic compound of Chemical Formula 1:

(Continued)

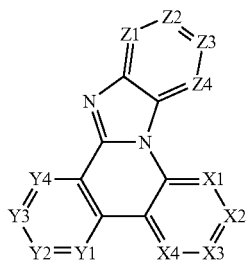

Chemical Formula 1 wherein X1 is CR1 or N, X2 is CR2 or N, X3 is CR3 or N, X4 is CR4 or N, Y1 is CR5 or N, Y2 is CR6 or N, Y3 is CR7 or N, Y4 is CR8 or N, Z1 is CR9 or N, Z2 is CR10 or N, Z3 is CR11 or N, and Z4 is CR12 or N, wherein X1 to X4, Y1 to Y4 and Z1 to Z4 are not N at the same time; and
at least one of R1 to R12 is Chemical Formula 2:

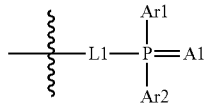

Chemical Formula 2 wherein A1 is O, S or Se; L1 is a direct bond, or a substituted or unsubstituted arylene or heteroarylene group; at least one of Ar1 and Ar2 is a substituted or unsubstituted alkyl group, and the rest is a substituted or unsubstituted aryl or heteroaryl group; and the rest are the same as or different from each other, and each independently is hydrogen, deuterium, halogen, cyano, nitro, hydroxyl, carbonyl, ester, imide, amide, or a substituted or unsubstituted: alkyl, cycloalkyl, alkoxy, aryloxy, alkylthioxy, arylthioxy, alkylsulfoxy, arylsulfoxy, alkenyl, silyl, boron, amine, arylphosphine oxide, aryl, or heteroaryl group; or adjacent groups bond to each other to form a substituted or unsubstituted ring,
and an organic light emitting device comprising the same.

11 Claims, 1 Drawing Sheet

(51) Int. Cl.
 *C09K 11/06* (2006.01)
 *H10K 50/16* (2023.01)
 *H10K 50/17* (2023.01)
 *H10K 50/18* (2023.01)

(52) U.S. Cl.
 CPC ........ *H10K 85/615* (2023.02); *H10K 85/622* (2023.02); *H10K 85/654* (2023.02); *C09K 2211/1018* (2013.01); *C09K 2211/1044* (2013.01); *H10K 50/16* (2023.02); *H10K 50/171* (2023.02); *H10K 50/18* (2023.02)

(58) Field of Classification Search
 CPC ............. H01L 51/5092; H01L 51/5096; C07F 9/6561; C09K 2211/1044; C09K 11/06; H10K 85/6572; H10K 85/654; H10K 85/615; H10K 85/622; H10K 50/16; H10K 50/171; H10K 50/18
 See application file for complete search history.

(56) References Cited

U.S. PATENT DOCUMENTS

| | | |
|---|---|---|
| 2014/0138659 A1 | 5/2014 | Shin et al. |
| 2016/0005980 A1* | 1/2016 | Ito ............................ C09B 57/10 |
| | | 257/40 |
| 2016/0268508 A1 | 9/2016 | Kim et al. |
| 2016/0293852 A1* | 10/2016 | Huh ..................... C09K 11/025 |
| 2017/0179407 A1 | 6/2017 | Park et al. |
| 2018/0069180 A1 | 3/2018 | Cha et al. |
| 2018/0076395 A1* | 3/2018 | Han ....................... C09K 11/06 |
| 2018/0114923 A1 | 4/2018 | Han et al. |
| 2018/0337339 A1* | 11/2018 | Senkovskyy ....... C07F 9/65522 |
| 2019/0006589 A1* | 1/2019 | Senkovskyy ....... C07F 9/65685 |

FOREIGN PATENT DOCUMENTS

| | | |
|---|---|---|
| KR | 10-20130037186 | 4/2013 |
| KR | 10-20130129543 | 11/2013 |
| KR | 10-20150037605 | 4/2015 |
| KR | 10-20160019846 | 2/2016 |
| KR | 10-20160067034 | 6/2016 |
| KR | 10-20160108237 | 9/2016 |
| KR | 10-20160108238 | 9/2016 |
| KR | 10-20170074731 | 6/2017 |
| WO | 2003012890 | 2/2003 |
| WO | 2015-190718 | 12/2015 |
| WO | 2016024728 | 2/2016 |
| WO | 2017-102822 | 6/2017 |

OTHER PUBLICATIONS

Lee et al., "Rational Design of Charge-Neutral, Near-Infrared-Emitting Osmium(II) Complexes and OLED Fabrication," Advanced Functional Materials 19:2639-2647 (2009).

\* cited by examiner

【FIG. 1】
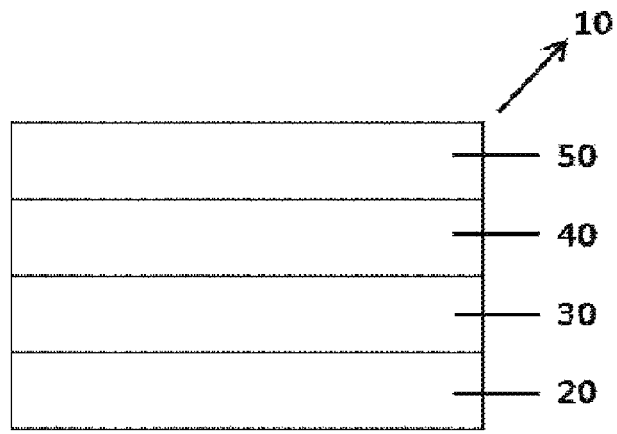
【FIG. 2】
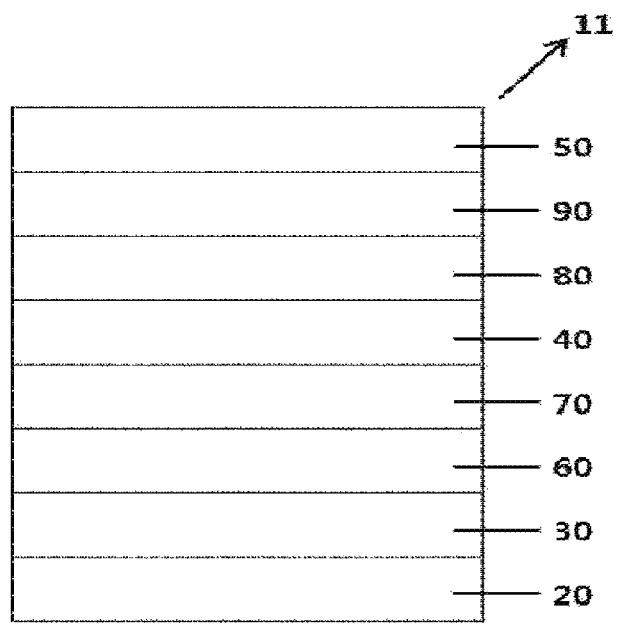

HETEROCYCLIC COMPOUND AND ORGANIC LIGHT EMITTING ELEMENT COMPRISING SAME

CROSS-REFERENCE TO RELATED APPLICATIONS

This application is a National Stage Application of International Application No. PCT/KR2018/012970 filed on Oct. 30, 2018, which claims priority to and the benefits of Korean Patent Application No. 10-2018-0013363, filed with the Korean Intellectual Property Office on Feb. 2, 2018, the entire contents of which are incorporated herein by reference.

The present specification relates to a heterocyclic compound and an organic light emitting device comprising the same.

BACKGROUND

An organic light emission phenomenon generally refers to a phenomenon converting electrical energy to light energy using an organic material. An organic light emitting device using an organic light emission phenomenon normally has a structure comprising an anode, a cathode, and an organic material layer therebetween. Herein, the organic material layer is often formed in a multilayer structure formed with different materials in order to increase efficiency and stability of the organic light emitting device, and for example, can be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.

Development of new materials for such an organic light emitting device has been continuously required.

PRIOR ART DOCUMENTS (Patent Document 1) International Patent Application Publication No. WO2003-012890

BRIEF DESCRIPTION

Technical Problem

The present specification is directed to providing a heterocyclic compound and an organic light emitting device comprising the same.

Technical Solution

One embodiment of the present specification provides a heterocyclic compound of the following Chemical Formula 1:

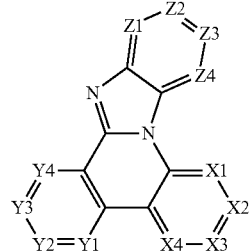

Chemical Formula 1 wherein in Chemical Formula 1:
X1 is CR1 or N, X2 is CR2 or N, X3 is CR3 or N, X4 is CR4 or N, Y1 is CR5 or N, Y2 is CR6 or N, Y3 is CR7 or N, Y4 is CR8 or N, Z1 is CR9 or N, Z2 is CR10 or N, Z3 is CR11 or N, and Z4 is CR12 or N,
wherein X1 to X4, Y1 to Y4 and Z1 to Z4 are not N at the same time; and
at least one of R1 to R12 is a group of the following Chemical Formula 2, and the rest are the same as or different from each other, and each independently is hydrogen, deuterium, a halogen group, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine oxide group, a substituted or unsubstituted aryl group, or a substituted or unsubstituted heteroaryl group, or adjacent groups bond to each other to form a substituted or unsubstituted ring;

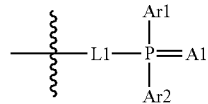

Chemical Formula 2 wherein in Chemical Formula 2:
A1 is O, S or Se;
L1 is a direct bond, a substituted or unsubstituted arylene group, or a substituted or unsubstituted heteroarylene group;
at least one of Ar1 and Ar2 is a substituted or unsubstituted alkyl group, and the rest is a substituted or unsubstituted aryl group, or a substituted or unsubstituted heteroaryl group; and

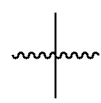

is a site bonding to Chemical Formula 1.

Another embodiment of the present specification provides an organic light emitting device comprising a first electrode; a second electrode provided opposite to the first electrode; and one or more organic material layers provided between the first electrode and the second electrode, wherein one or more layers of the organic material layers comprise the heterocyclic compound of Chemical Formula 1.

Advantageous Effects

An organic light emitting device comprising a heterocyclic compound of Chemical Formula 1 according to the present specification as a material of an organic material layer has properties of low driving voltage, high efficiency and/or long lifetime properties.

DESCRIPTION OF DRAWINGS

FIG. 1 is a diagram illustrating an organic light emitting device (10) according to one embodiment of the present specification.

FIG. 2 is a diagram illustrating an organic light emitting device (11) according to another embodiment of the present specification.

10, 11: Organic Light Emitting Device
20: Substrate
30: First Electrode
40: Light Emitting Layer
50: Second Electrode
60: Hole Injection Layer
70: Hole Transfer Layer
80: Electron Transfer Layer
90: Electron Injection Layer

DETAILED DESCRIPTION

Hereinafter, the present specification will be described in more detail.

One embodiment of the present specification provides a heterocyclic compound of Chemical Formula 1.

The heterocyclic compound of Chemical Formula 1 according to one embodiment of the present specification has a 5-membered or higher heterocyclic compound comprising two or more Ns as a core, and comprises Chemical Formula 2 in which at least one of Ar1 and Ar2 is a substituted or unsubstituted alkyl group as a substituent, and therefore, an organic light emitting device using this as an organic material layer has properties of low driving voltage, high efficiency and/or long lifetime.

In the present specification, a description of a certain part "comprising" certain constituents means capable of further comprising other constituents, and does not exclude other constituents unless particularly stated on the contrary.

In the present specification, a description of one member being placed "on" another member comprises not only a case of the one member adjoining the another member but a case of still another member being present between the two members.

Examples of substituents in the present specification are described below, however, the substituents are not limited thereto.

The term "substitution" means a hydrogen atom bonding to a carbon atom of a compound is changed to another substituent, and the position of substitution is not limited as long as it is a position at which a hydrogen atom is substituted, that is, a position at which a substituent can substitute, and when two or more substituents substitute, the two or more substituents can be the same as or different from each other.

In the present specification, the term "substituted or unsubstituted" means being substituted with one, two or more substituents selected from the group consisting of deuterium, a halogen group, a cyano group, a nitro group, an imide group, an amide group, a carbonyl group, an ether group, an ester group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine group, a substituted or unsubstituted phosphine oxide group, a substituted or unsubstituted aryl group, and a substituted or unsubstituted heteroaryl group, or being substituted with a substituent linking two or more substituents among the substituents illustrated above, or having no substituents. For example, "a substituent linking two or more substituents" can comprise a biphenyl group. In other words, a biphenyl group can be an aryl group, or interpreted as a substituent linking two phenyl groups.

In the present specification,

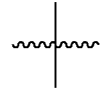

means a site bonding to other substituents or bonding sites.

In the present specification, the halogen group can comprise fluorine, chlorine, bromine or iodine.

In the present specification, the number of carbon atoms of the imide group is not particularly limited, but is preferably from 1 to 30. Specifically, compounds having structures as below can be included, however, the imide group is not limited thereto:

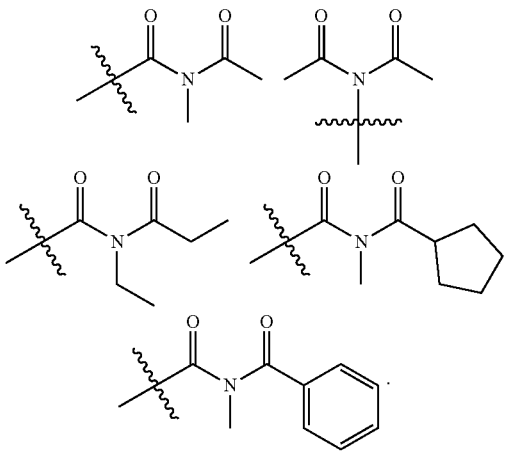

In the present specification, in the amide group, the nitrogen of the amide group can be substituted with a linear, branched or cyclic alkyl group having 1 to 30 carbon atoms or an aryl group having 6 to 30 carbon atoms. Specifically, compounds having the following structural formulae can be included, however, the amide group is not limited thereto:

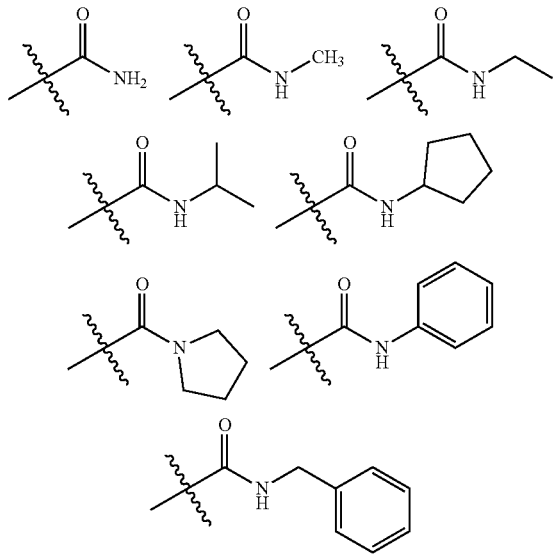

In the present specification, the number of carbon atoms of the carbonyl group is not particularly limited, but is preferably from 1 to 30. Specifically, compounds having structures as below can be included, however, the carbonyl group is not limited thereto:

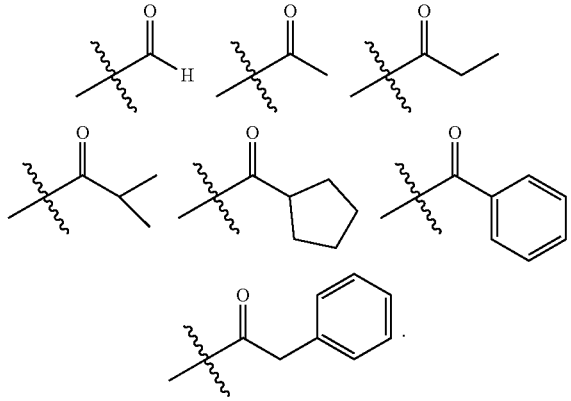

In the present specification, in the ester group, the oxygen of the ester group can be substituted with a linear, branched or cyclic alkyl group having 1 to 25 carbon atoms or an aryl group having 6 to 30 carbon atoms. Specifically, compounds having the following structural formulae can be included, however, the ester group is not limited thereto:

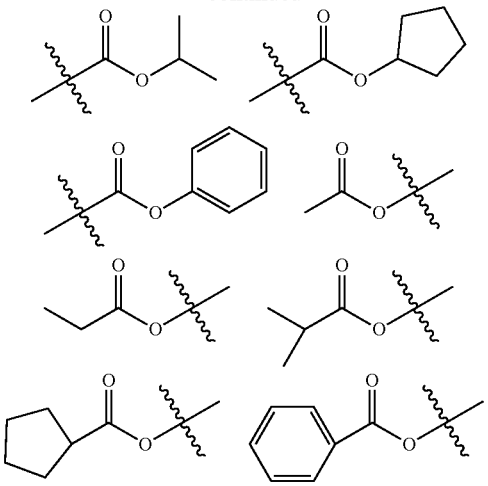

In the present specification, in the ether group, the oxygen of the ether group can be substituted with a linear, branched or cyclic alkyl group having 1 to 25 carbon atoms or an aryl group having 6 to 30 carbon atoms. Specifically, compounds having the following structural formulae can be included, however, the ether group is not limited thereto:

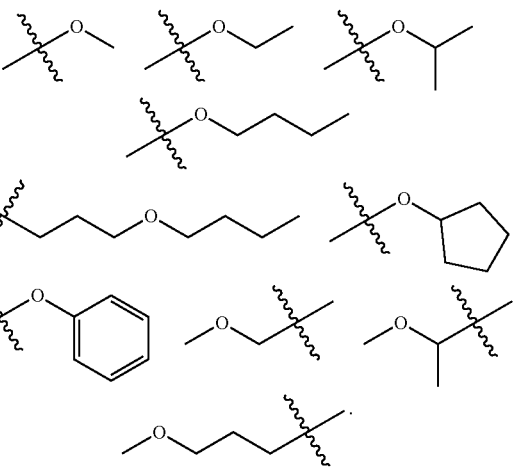

In the present specification, the alkyl group can be linear or branched, and although not particularly limited thereto, the number of carbon atoms is preferably from 1 to 30. Specific examples thereof comprise methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the cycloalkyl group is not particularly limited, but preferably has 3 to 30 carbon atoms. Specific examples thereof comprise cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3- dimethylcyclohexyl, 3,4,5-trimethylcyclohexyl, 4-tert-butyl-cyclohexyl, cycloheptyl, cyclooctyl and the like, but are not limited thereto.

In the present specification, the alkoxy group can be linear, branched or cyclic. The number of carbon atoms of the alkoxy group is not particularly limited, but is preferably from 1 to 30. Specific examples thereof can comprise methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy and the like, but are not limited thereto.

In the present specification, the amine group can be selected from the group consisting of —NH$_2$, an alkylamine group, an N-alkylarylamine group, an arylamine group, an N-arylheteroarylamine group, an N-alkylheteroarylamine group and a heteroarylamine group, and although not particularly limited thereto, the number of carbon atoms is preferably from 1 to 30. Specific examples of the amine group can comprise a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenyl-phenanthrenyl amine group, an N-biphenylphenanthrenylamine group, an N-phenylfluorenylamine group, an N-phenyl-terphenylamine group, an N-phenanthrenylfluorenylamine group, an N-biphenylfluorenylamine group and the like, but are not limited thereto.

In the present specification, the N-alkylarylamine group means an amine group in which N of the amine group is substituted with an alkyl group and an aryl group.

In the present specification, the N-arylheteroarylamine group means an amine group in which N of the amine group is substituted with an aryl group and a heteroaryl group.

In the present specification, the N-alkylheteroarylamine group means an amine group in which N of the amine group is substituted with an alkyl group and a heteroaryl group.

In the present specification, examples of the alkylamine group comprise a substituted or unsubstituted monoalkylamine group, or a substituted or unsubstituted dialkylamine group. The alkyl group in the alkylamine group can be a linear or branched alkyl group. The alkylamine group comprising two or more alkyl groups can comprise linear alkyl groups, branched alkyl groups, or both linear alkyl groups and branched alkyl groups. For example, the alkyl group in the alkylamine group can be selected from among the examples of the alkyl group described above.

In the present specification, the alkyl group in the N-alkylarylamine group, the alkylthioxy group, the alkylsulfoxy group and the N-alkylheteroarylamine group is the same as the examples of the alkyl group described above. Specifically, the alkylthioxy group can comprise a methylthioxy group, an ethylthioxy group, a tert-butylthioxy group, a hexylthioxy group, an octylthioxy group and the like, and the alkylsulfoxy group can comprise a methylsulfoxy group, an ethylsulfoxy group, a propylsulfoxy group, a butylsulfoxy group and the like, however, the alkylthoixy group and the alkylsulfoxy group are not limited thereto.

In the present specification, the alkenyl group can be linear or branched, and although not particularly limited thereto, the number of carbon atoms is preferably from 2 to 30. Specific examples thereof can comprise vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenyl-vinyl-1-yl, 2-phenyl-2-(naphthyl-1-yl)vinyl-1-yl, 2,2-bis-(diphenyl-1-yl)vinyl-1-yl, a stilbenyl group, a styrenyl group and the like, but are not limited thereto.

In the present specification, specific examples of the silyl group can comprise a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the boron group can be —BR$_{100}$R$_{101}$, and R$_{100}$ and R$_{101}$ are the same as or different from each other and can be each independently selected from the group consisting of hydrogen, deuterium, halogen, a cyano group, a substituted or unsubstituted monocyclic or polycyclic cycloalkyl group having 3 to 30 carbon atoms, a substituted or unsubstituted linear or branched alkyl group having 1 to 30 carbon atoms, a substituted or unsubstituted monocyclic or polycyclic aryl group having 6 to 30 carbon atoms, and a substituted or unsubstituted monocyclic or polycyclic heteroaryl group having 2 to 30 carbon atoms.

In the present specification, examples of the phosphine oxide group can specifically comprise an alkylphosphine oxide group, an arylphosphine oxide group and the like, and more specifically comprise a diphenylphosphine oxide group, a dinaphthylphosphine oxide group and the like, but are not limited thereto.

In the present specification, the aryl group is not particularly limited, but preferably has 6 to 30 carbon atoms, and the aryl group can be monocyclic or polycyclic.

When the aryl group is a monocyclic aryl group, the number of carbon atoms is not particularly limited, but is preferably from 6 to 30. Specific examples of the monocyclic aryl group can comprise a phenyl group, a biphenyl group, a terphenyl group and the like, but are not limited thereto.

When the aryl group is a polycyclic aryl group, the number of carbon atoms is not particularly limited, but is preferably from 10 to 30. Specific example of the polycyclic aryl group can comprise a naphthyl group, an anthracene group, a phenanthryl group, a triphenylene group, a pyrene group, a phenalene group, a perylene group, a chrysenyl group, a fluorenyl group and the like, but are not limited thereto.

In the present specification, the fluorenyl group can be substituted, and adjacent groups can bond to each other to form a ring.

When the fluorenyl group is substituted,

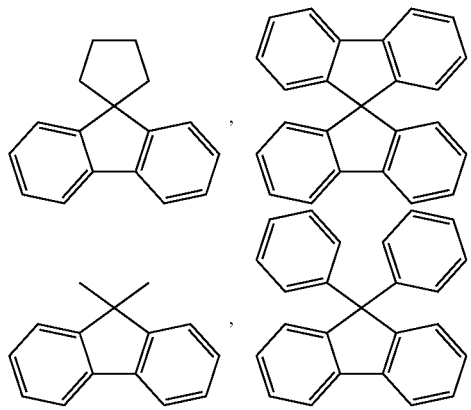

-continued

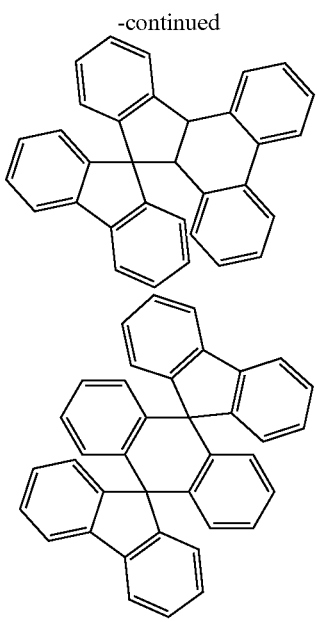

and the like can be included. However, the structure is not limited thereto.

In the present specification, an "adjacent" group can mean a substituent substituting an atom directly linked to an atom substituted by the corresponding substituent, a substituent sterically most closely positioned to the corresponding substituent, or another substituent substituting an atom substituted by the corresponding substituent. For example, two substituents substituting ortho positions in a benzene ring, and two substituents substituting the same carbon in an aliphatic ring can be interpreted as groups "adjacent" to each other.

In the present specification, the aryl group in the aryloxy group, the arylthioxy group, the arylsulfoxy group, the N-arylalkylamine group, the N-arylheteroarylamine group and the arylphosphine group is the same as the examples of the aryl group described above. Specific examples of the aryloxy group can comprise a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group and the like. Specific examples of the arylthioxy group can comprise a phenylthioxy group, a 2-methylphenylthioxy group, a 4-tert-butylphenylthioxy group and the like, and specific examples of the arylsulfoxy group can comprise a benzenesulfoxy group, a p-toluenesulfoxy group and the like. However, the aryloxy group, the arylthioxy group and the arylsulfoxy group are not limited thereto.

In the present specification, examples of the arylamine group comprise a substituted or unsubstituted monoarylamine group, or a substituted or unsubstituted diarylamine group. The aryl group in the arylamine group can be a monocyclic aryl group or a polycyclic aryl group. The arylamine group comprising two or more aryl groups can comprise monocyclic aryl groups, polycyclic aryl groups, or both monocyclic aryl groups and polycyclic aryl groups. For example, the aryl group in the arylamine group can be selected from among the examples of the aryl group described above.

In the present specification, the heteroaryl group is a group comprising one or more atoms that are not carbon, that is, heteroatoms, and specifically, the heteroatom can comprise one or more atoms selected from the group consisting of 0, N, Se, S and the like. The number of carbon atoms is not particularly limited, but is preferably from 2 to 30, and the heteroaryl group can be monocyclic or polycyclic. Examples of the heterocyclic group can comprise a thiophene group, a furanyl group, a pyrrole group, an imidazolyl group, a triazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a quinolinyl group, a quinazolinyl group, a quinoxalinyl group, a phthalazinyl group, a pyridopyrimidyl group, a pyridopyrazinyl group, a pyrazine-pyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthridine group, a phenanthridyl group, a phenanthroline group, an isoxazolyl group, a thiadiazolyl group, a phenothiazinyl group, a dibenzofuran group and the like, but are not limited thereto.

In the present specification, examples of the heteroarylamine group comprise a substituted or unsubstituted monoheteroarylamine group, or a substituted or unsubstituted diheteroarylamine group. The heteroarylamine group comprising two or more heteroaryl groups can comprise monocyclic heteroaryl groups, polycyclic heteroaryl groups, or both monocyclic heteroaryl groups and polycyclic heteroaryl groups. For example, the heteroaryl group in the heteroarylamine group can be selected from among the examples of the heteroaryl group described above.

In the present specification, examples of the heteroaryl group in the N-arylheteroarylamine group and the N-alkylheteroarylamine group are the same as the examples of the heteroaryl group described above.

In the present specification, the arylene group means an aryl group having two bonding sites, that is, a divalent group. Descriptions on the aryl group provided above can be applied thereto except for each being a divalent group.

In the present specification, the heteroarylene group means a heteroaryl group having two bonding sites, that is, a divalent group. Descriptions on the heteroaryl group provided above can be applied thereto except for each being a divalent group.

In the present specification, the "ring" in the substituted or unsubstituted ring formed by adjacent groups bonding to each other means a substituted or unsubstituted hydrocarbon ring, or a substituted or unsubstituted heteroring.

In the present specification, the hydrocarbon ring can be aromatic, aliphatic or a fused ring of aromatic and aliphatic, and can be selected from among the examples of the cycloalkyl group or the aryl group except for those that are not monovalent.

In the present specification, the aromatic ring can be monocyclic or polycyclic, and can be selected from among the examples of the aryl group except for those that are not monovalent.

In the present specification, the heteroring comprises one or more atoms that are not carbon, that is, heteroatoms, and specifically, the heteroatom can comprise one or more atoms selected from the group consisting of O, N, Se, S and the like. The heterering can be monocyclic or polycyclic, aromatic, aliphatic or a fused ring of aromatic and aliphatic, and can be selected from among the examples of the heteroaryl group or the heterocyclic group except for those that are not monovalent.

According to one embodiment of the present specification, in Chemical Formula 1, X1 is CR1, X2 is CR2, X3 is CR3, X4 is CR4, Y1 is CR5, Y2 is CR6, Y3 is CR7, Y4 is CR8, Z1 is CR9, Z2 is CR10, Z3 is CR11, and Z4 is CR12.

According to one embodiment of the present specification, Chemical Formula 1 is the following Chemical Formula 1-1:

Chemical Formula 1-1

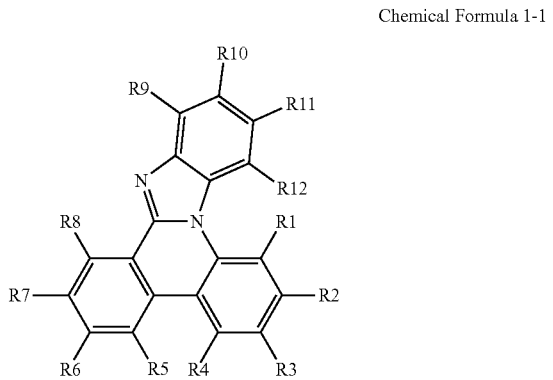

wherein in Chemical Formula 1-1:
R1 to R12 have the same definitions as in Chemical Formula 1.

According to one embodiment of the present specification, Chemical Formula 1 is the following Chemical Formula 1-2:

Chemical Formula 1-2

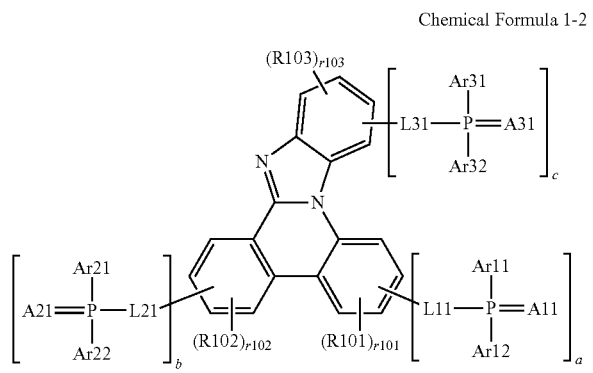

wherein in Chemical Formula 1-2:
A11, A21 and A31 are the same as or different from each other, and each independently is O, S or Se;
L11, L21 and L31 are the same as or different from each other, and each independently is a direct bond, a substituted or unsubstituted arylene group, or a substituted or unsubstituted heteroarylene group;
at least one of Ar11 and Ar12 is a substituted or unsubstituted alkyl group, and the other one is a substituted or unsubstituted aryl group, or a substituted or unsubstituted heteroaryl group;
at least one of Ar21 and Ar22 is a substituted or unsubstituted alkyl group, and the other one is a substituted or unsubstituted aryl group, or a substituted or unsubstituted heteroaryl group;
at least one of Ar31 and Ar32 is a substituted or unsubstituted alkyl group, and the other one is a substituted or unsubstituted aryl group, or a substituted or unsubstituted heteroaryl group;
R101 to R103 are the same as or different from each other, and each independently hydrogen, deuterium, a halogen group, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine oxide group, a substituted or unsubstituted aryl group, or a substituted or unsubstituted heteroaryl group, or adjacent groups bond to each other to form a substituted or unsubstituted ring;
a, b and c are each an integer of 0 to 4;
a+b+c is 1≤a+b+c≤12;
r101, r102 and r103 are each an integer of 0 to 4;
when r101 is 2 or greater, the two or more R101s are the same as or different from each other;
when r102 is 2 or greater, the two or more R102s are the same as or different from each other;
when r103 is 2 or greater, the two or more R103s are the same as or different from each other;
when a is 2 or greater, the two or more structures in the parentheses are the same as or different from each other;
when b is 2 or greater, the two or more structures in the parentheses are the same as or different from each other; and
when c is 2 or greater, the two or more structures in the parentheses are the same as or different from each other.

According to one embodiment of the present specification, in Chemical Formula 1, at least one of R1 to R12 is the group of Chemical Formula 2, and the rest are the same as or different from each other, and each independently is hydrogen, a cycloalkyl group, an arylphosphine oxide group, an aryl group that is unsubstituted or substituted with a cyano group or an alkyl group substituted with a halogen group, or a heteroaryl group, or adjacent groups bond to each other to form an aromatic hydrocarbon ring that is unsubstituted or substituted with an aryl group, or a heterering.

According to one embodiment of the present specification, in Chemical Formula 1, at least one of R1 to R12 is the group of Chemical Formula 2, and the rest are the same as or different from each other, and each independently is hydrogen, a cyclohexyl group, a diphenylphosphine oxide group, a phenyl group that is unsubstituted or substituted with a cyano group or an alkyl group substituted with a halogen group, a naphthyl group, a phenanthryl group, a triphenylene group, a pyridyl group, a carbazolyl group, or a dibenzofuran group, or adjacent groups bond to each other to form a benzene ring that is unsubstituted or substituted with an aryl group, or a pyridine ring.

According to one embodiment of the present specification, in Chemical Formula 1, at least one of R1 to R12 is the group of Chemical Formula 2, and the rest are the same as or different from each other, and each independently is hydrogen, a cyclohexyl group, a diphenylphosphine oxide group, a phenyl group that is unsubstituted or substituted with a cyano group or a trifluoromethyl group, a naphthyl group, a phenanthryl group, a triphenylene group, a pyridyl group, a carbazolyl group, or a dibenzofuran group, or adjacent groups bond to each other to form a benzene ring that is unsubstituted or substituted with a phenyl group, or a pyridine ring.

According to one embodiment of the present specification, in Chemical Formula 1, at least one of R1 to R12 is the group of Chemical Formula 2, and the rest are the same as or different from each other, and each independently is hydrogen, a cycloalkyl group, an arylphosphine oxide group, an aryl group that is unsubstituted or substituted with a cyano group or an alkyl group substituted with a halogen group, or a heteroaryl group.

According to one embodiment of the present specification, in Chemical Formula 1, at least one of R1 to R12 is the group of Chemical Formula 2, and the rest are the same as or different from each other, and each independently is hydrogen, a cyclohexyl group, a diphenylphosphine oxide group, a phenyl group that is unsubstituted or substituted with a cyano group or an alkyl group substituted with a halogen group, a naphthyl group, a phenanthryl group, a triphenylene group, a pyridyl group, a carbazolyl group, or a dibenzofuran group.

According to one embodiment of the present specification, in Chemical Formula 1, at least one of R1 to R12 is the group of Chemical Formula 2, and the rest are the same as or different from each other, and each independently is hydrogen, a cyclohexyl group, a diphenylphosphine oxide group, a phenyl group that is unsubstituted or substituted with a cyano group or a trifluoromethyl group, a naphthyl group, a phenanthryl group, a triphenylene group, a pyridyl group, a carbazolyl group, or a dibenzofuran group.

According to one embodiment of the present specification, in Chemical Formula 1, adjacent groups among R1 to R12 bond to each other to form an aromatic hydrocarbon ring that is unsubstituted or substituted with an aryl group or a heteroring.

According to one embodiment of the present specification, in Chemical Formula 1, adjacent groups among R1 to R12 bond to each other to form a benzene ring that is unsubstituted or substituted with an aryl group or a pyridine ring.

According to one embodiment of the present specification, in Chemical Formula 1, adjacent groups among R1 to R12 bond to each other to form a benzene ring that is unsubstituted or substituted with a phenyl group or a pyridine ring.

According to one embodiment of the present specification, in Chemical Formula 2, L1 is a direct bond, an arylene group, or a heteroarylene group.

According to one embodiment of the present specification, in Chemical Formula 2, L1 is a direct bond, a phenylene group, a biphenylylene group, a naphthylene group, a divalent pyrene group, a pyridylene group, or a pyrimidylene group.

According to one embodiment of the present specification, in Chemical Formula 2, A1 is O.

According to one embodiment of the present specification, in Chemical Formula 2, A1 is S.

According to one embodiment of the present specification, in Chemical Formula 2, A1 is Se.

According to one embodiment of the present specification, in Chemical Formula 2, at least one of Ar1 and Ar2 is an alkyl group, and the rest is an aryl group that is unsubstituted or substituted with an alkyl group or an aryl group or a heteroaryl group.

According to one embodiment of the present specification, in Chemical Formula 2, at least one of Ar1 and Ar2 is a methyl group, an ethyl group, an n-propyl group, an isopropyl group, or a t-butyl group, and the rest is a phenyl group that is unsubstituted or substituted with an aryl group, a biphenyl group, a naphthyl group, a fluorenyl group that is unsubstituted or substituted with an alkyl group, or a pyridyl group.

According to one embodiment of the present specification, in Chemical Formula 2, at least one of Ar1 and Ar2 is a methyl group, an ethyl group, an n-propyl group, an isopropyl group, or a t-butyl group, and the rest is a phenyl group that is unsubstituted or substituted with a phenyl group, a biphenyl group, a naphthyl group, a fluorenyl group that is unsubstituted or substituted with a methyl group, or a pyridyl group.

According to one embodiment of the present specification, Chemical Formula 1 is selected from among the following compounds:

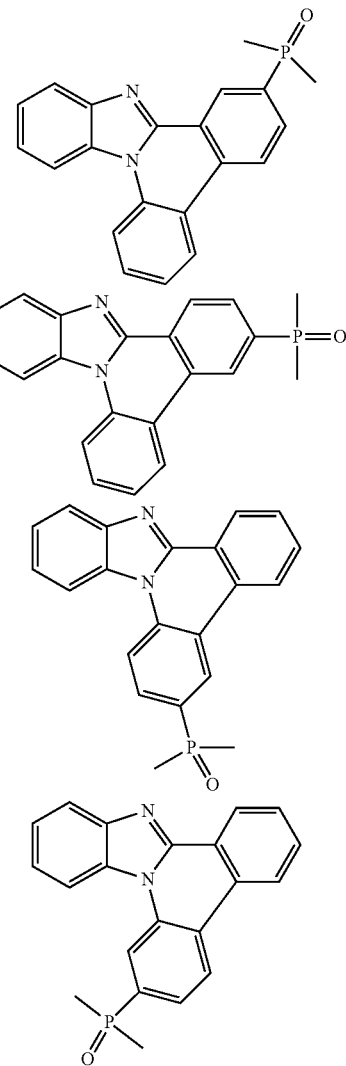

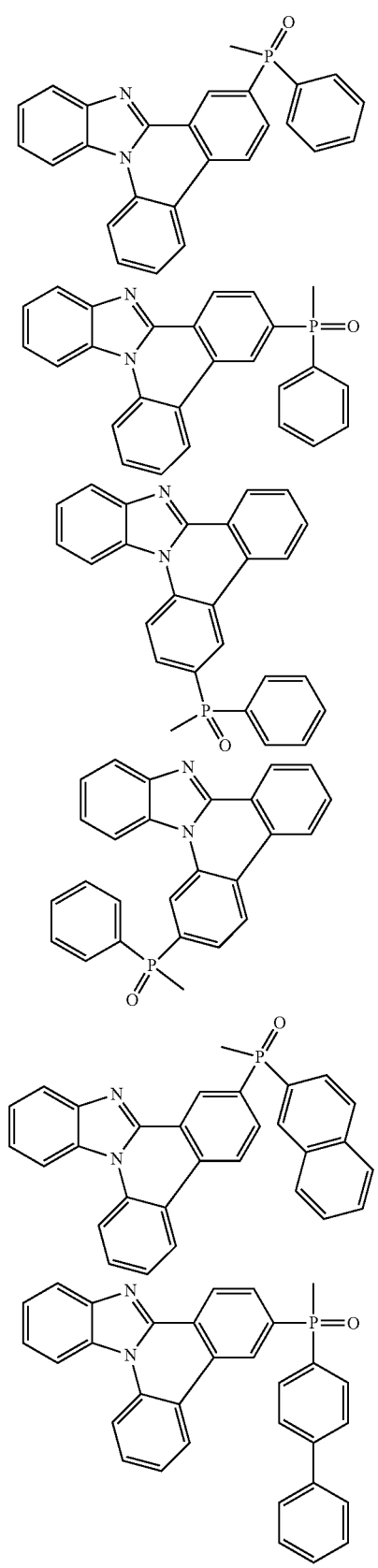
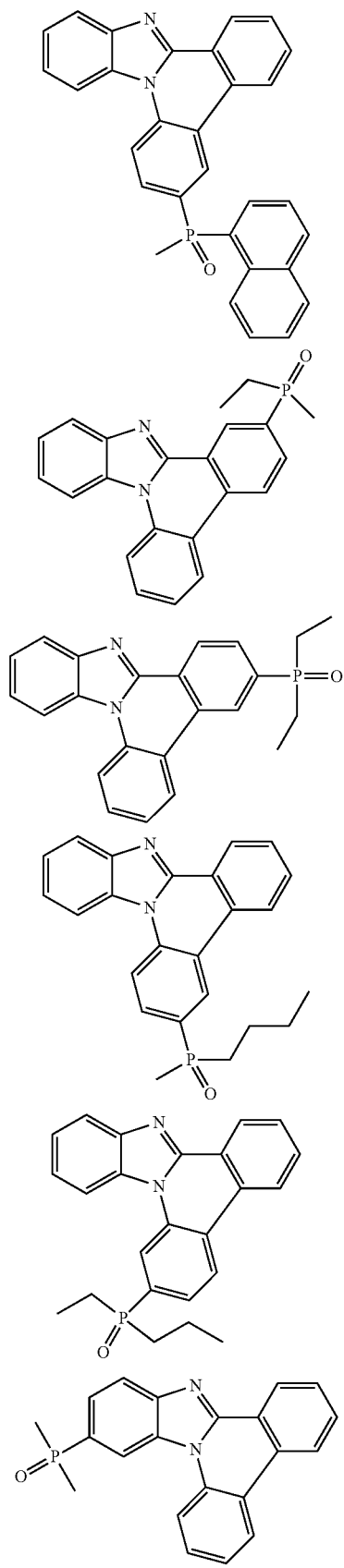

17
-continued
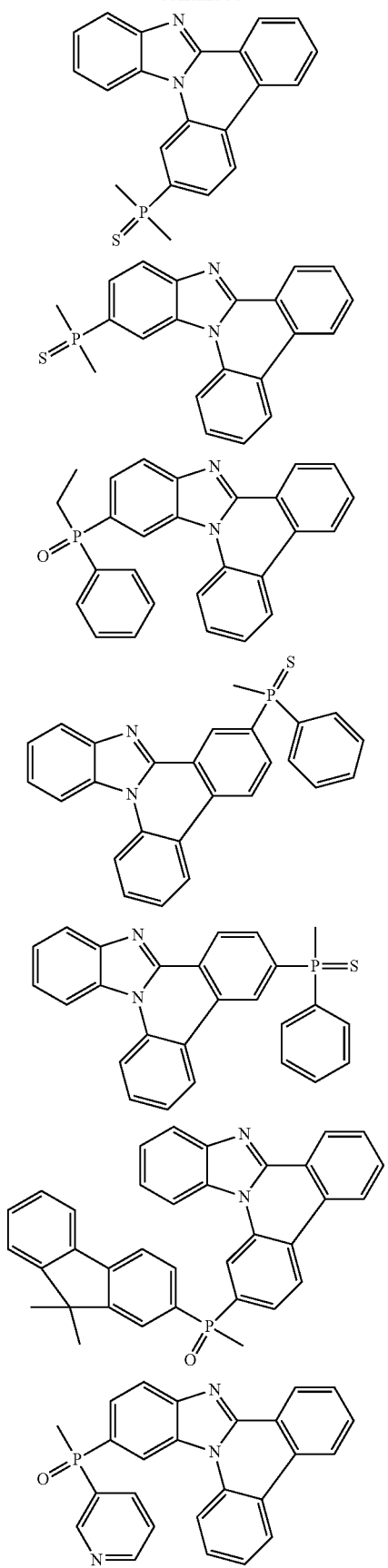
18
-continued
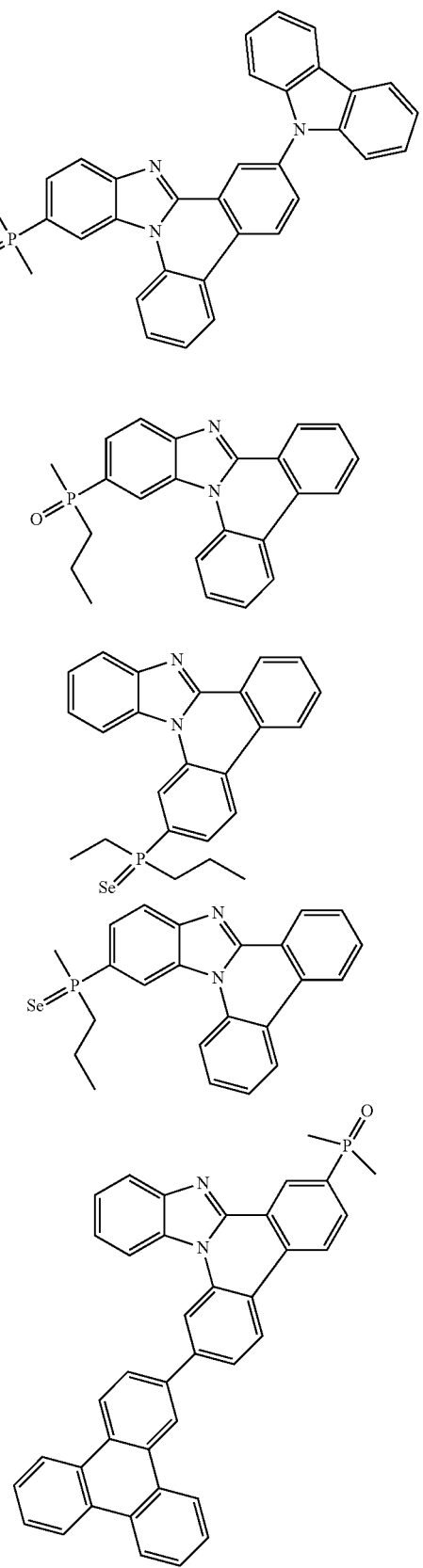

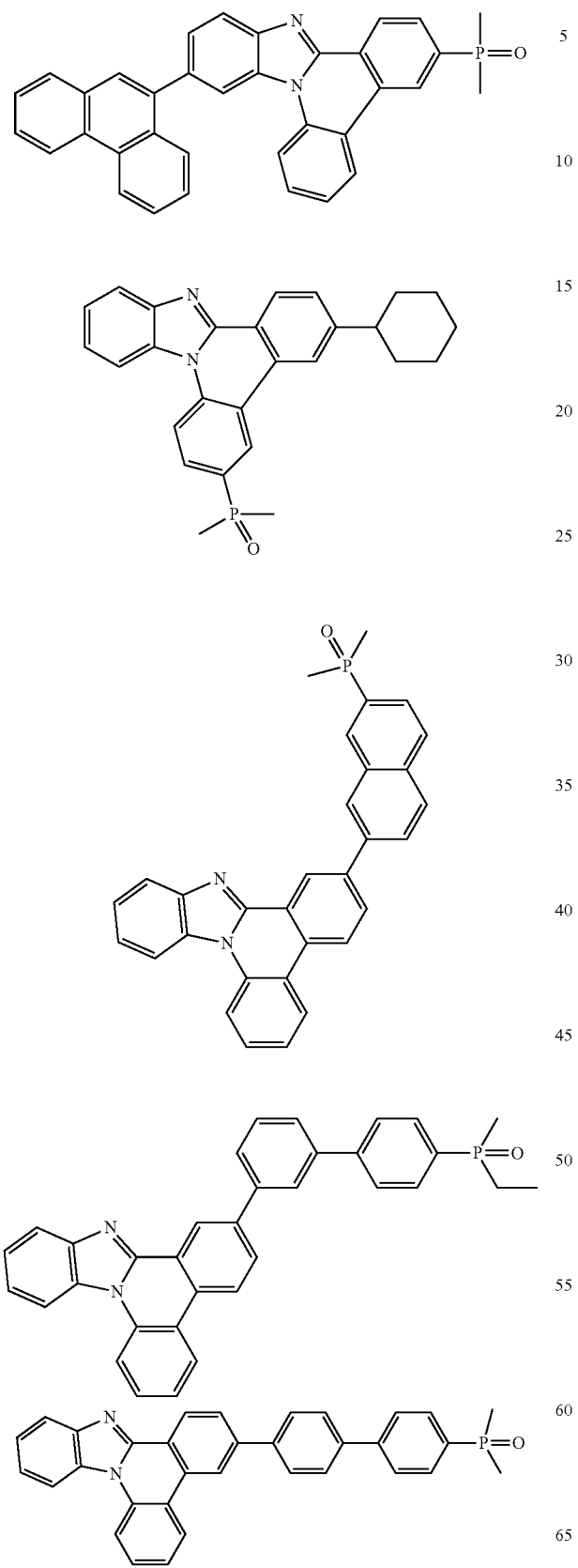
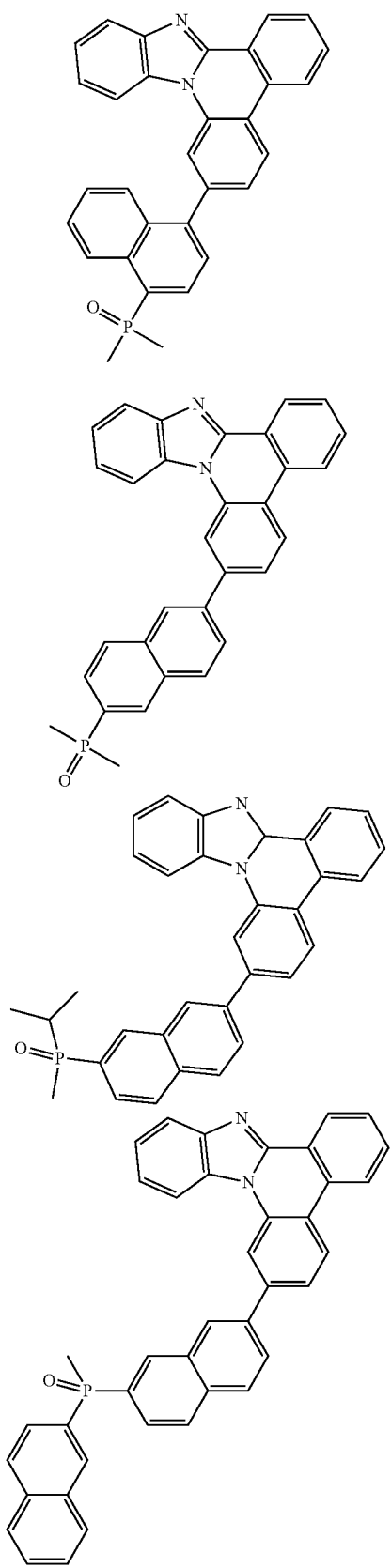

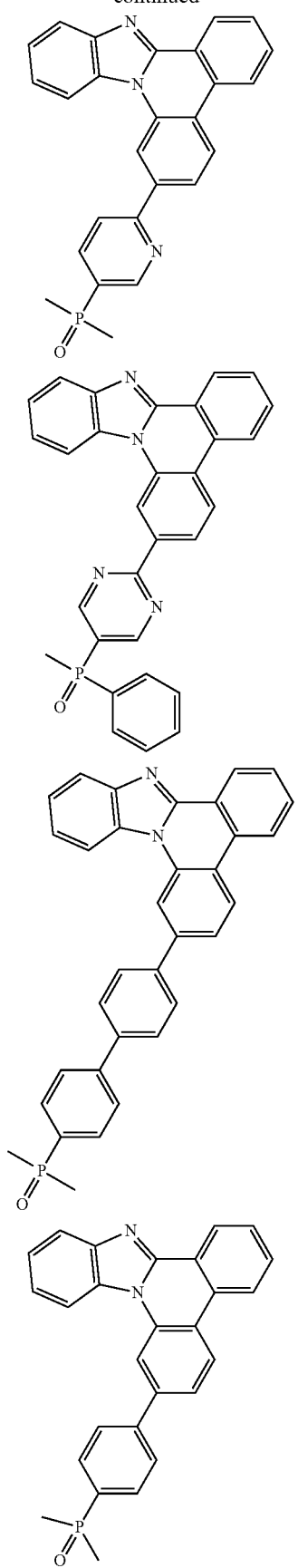
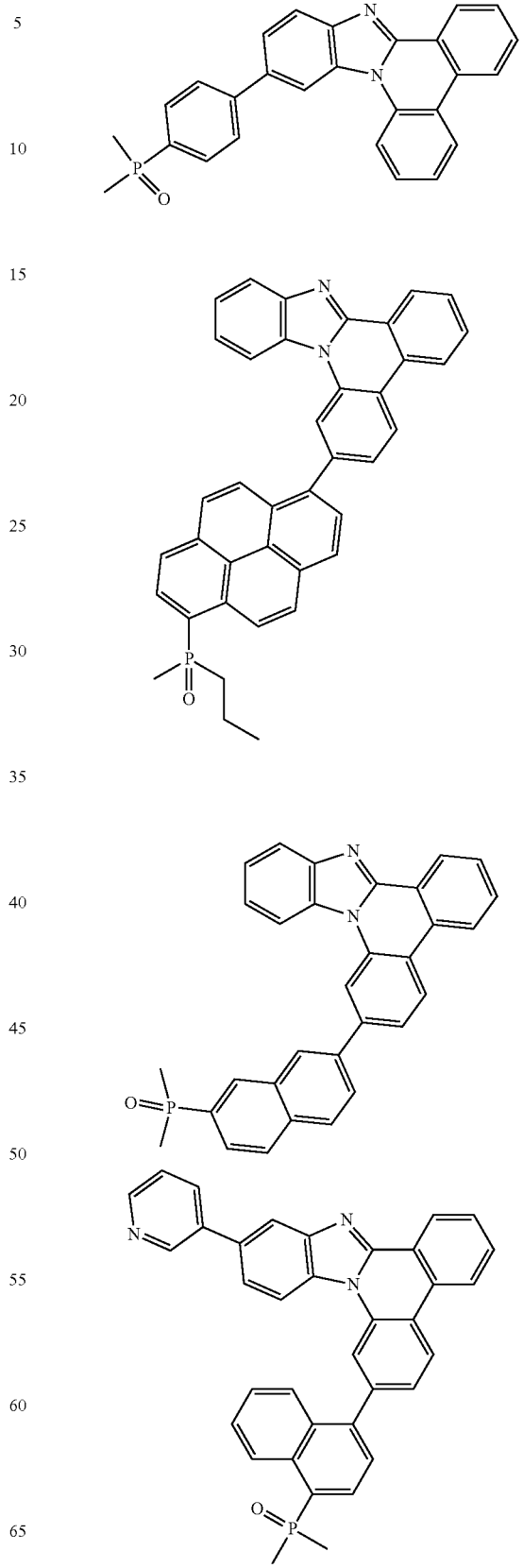

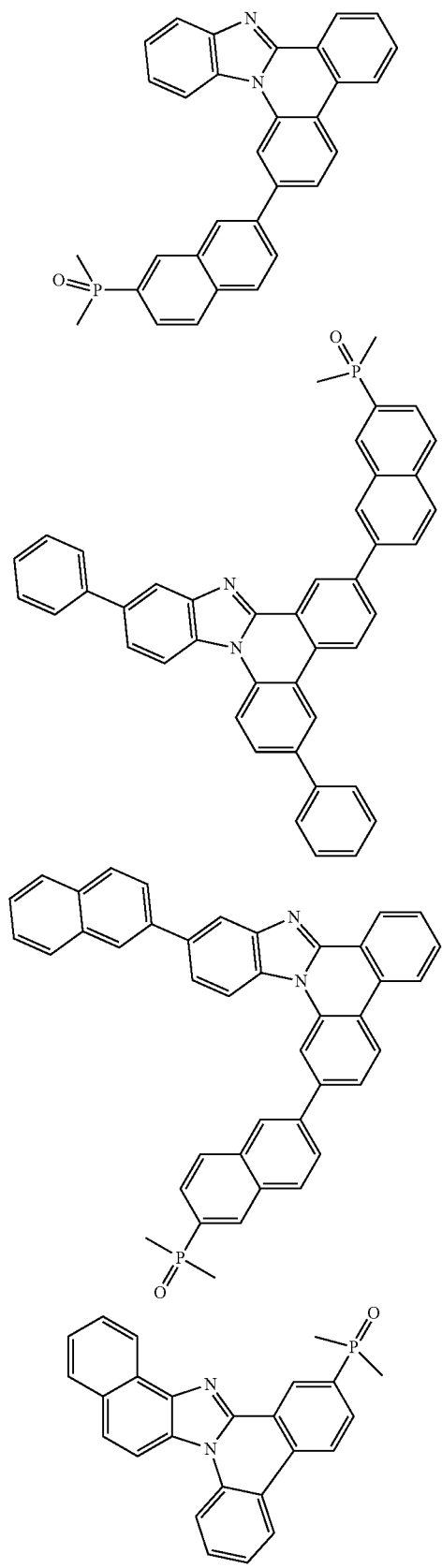
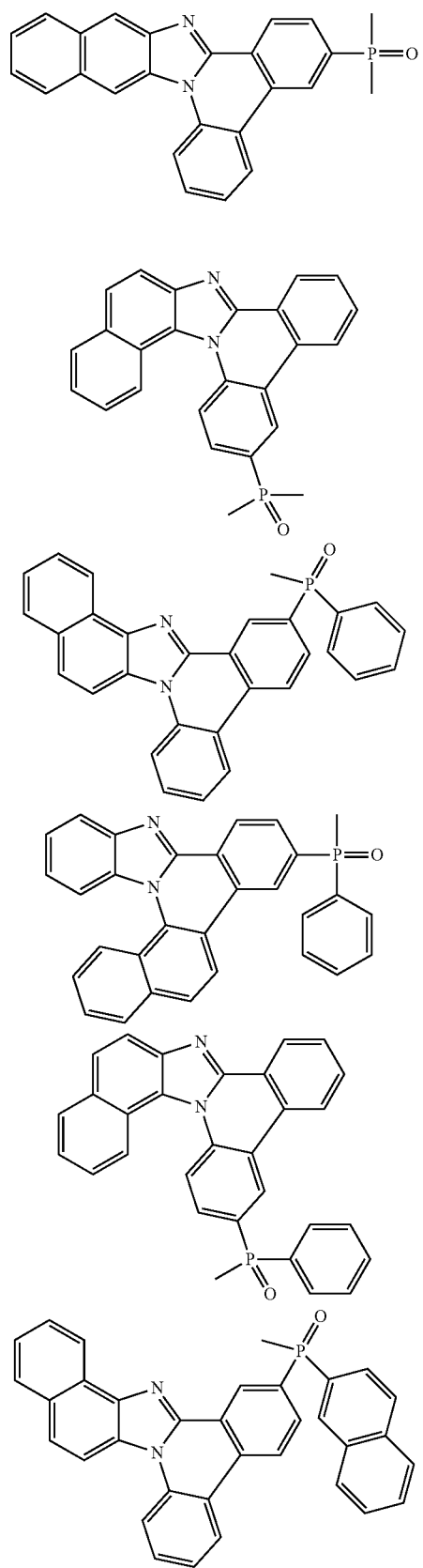

-continued
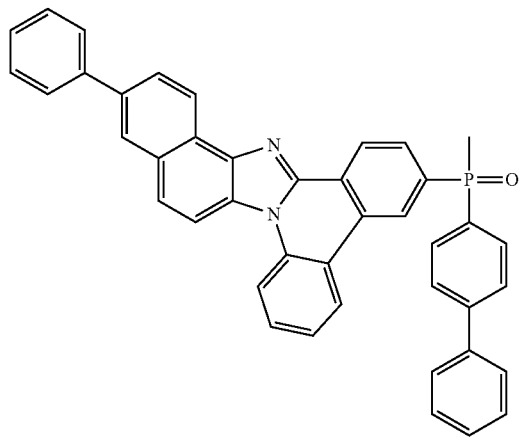
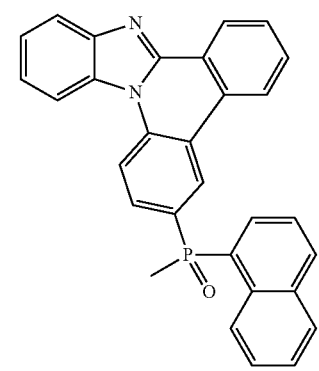
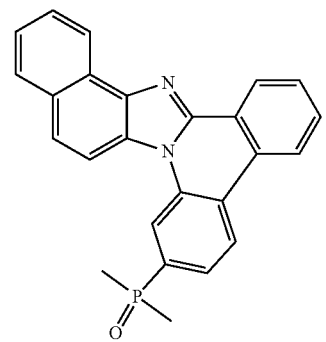
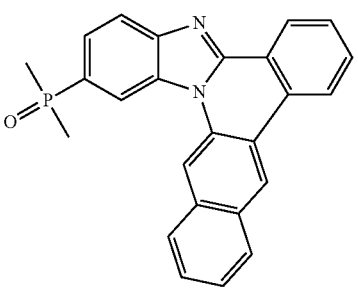
-continued
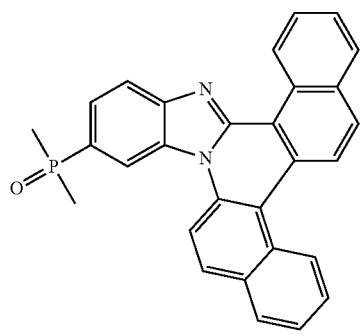
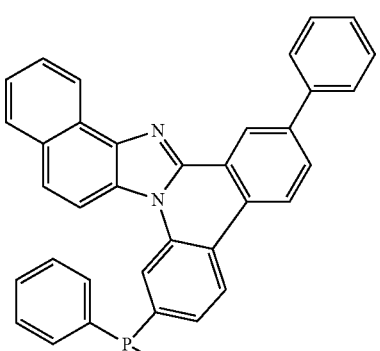
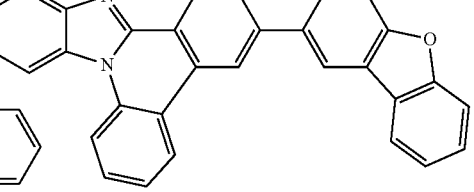
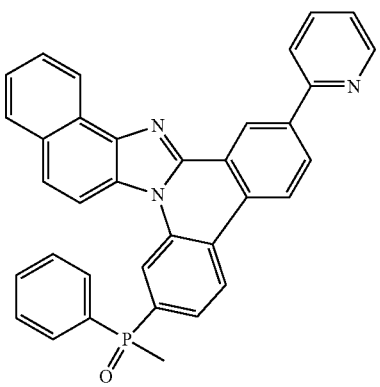
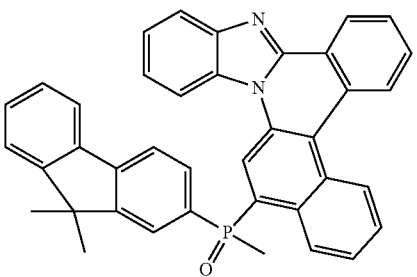

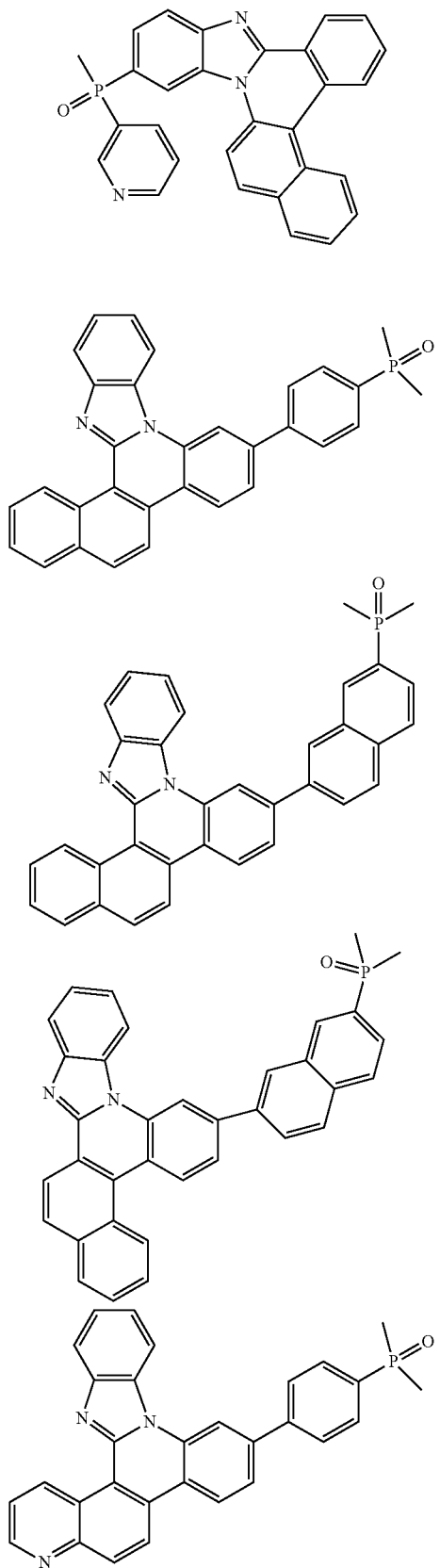
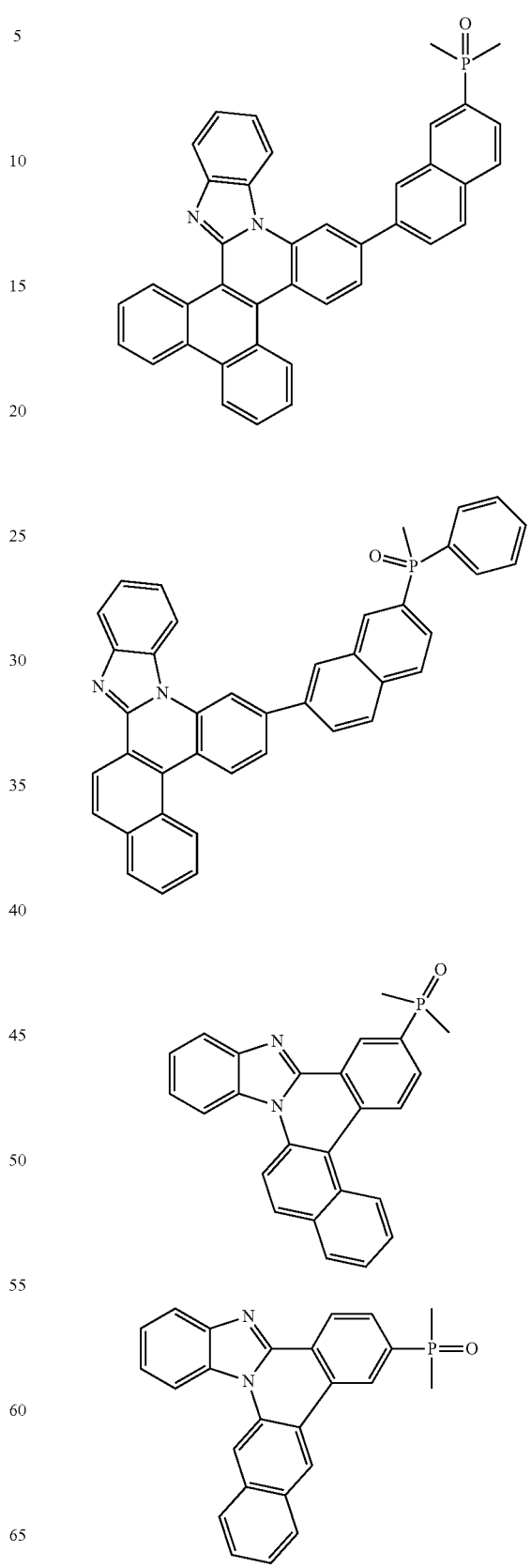

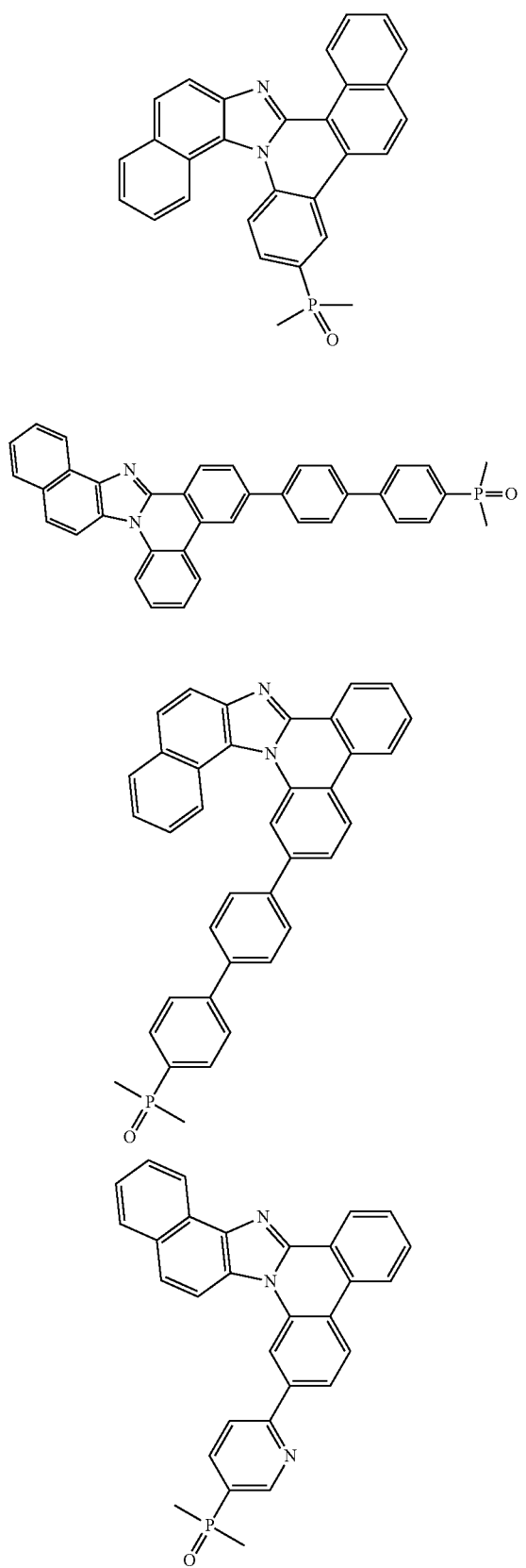
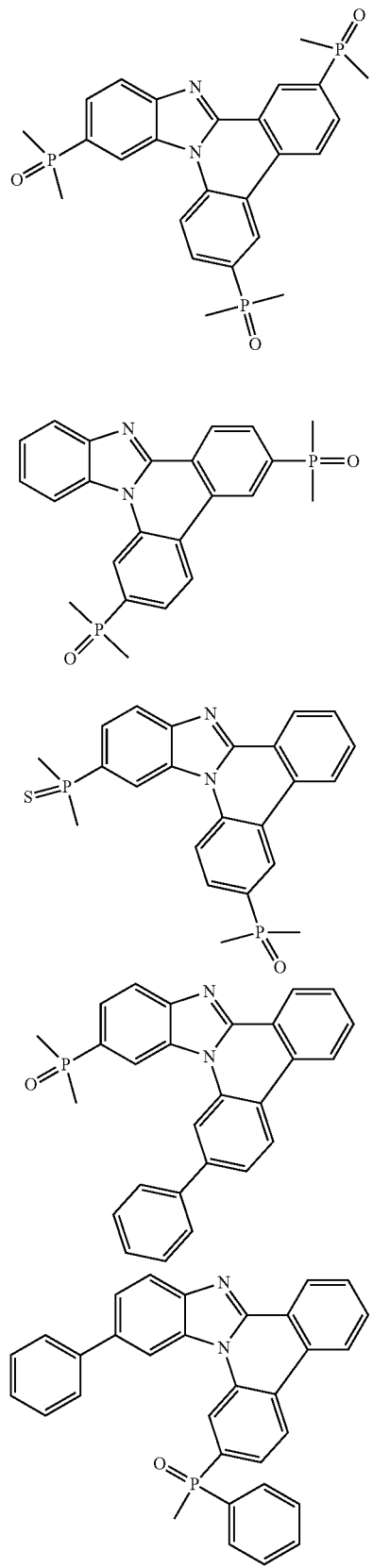

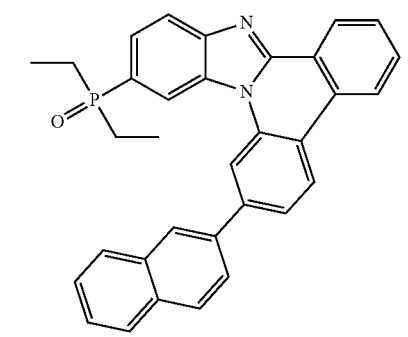
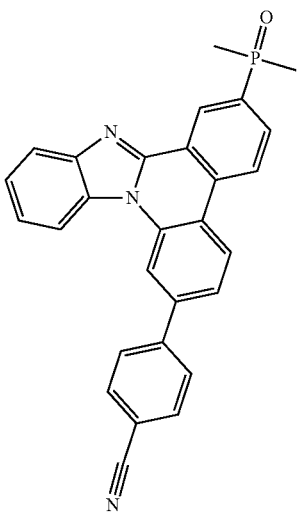
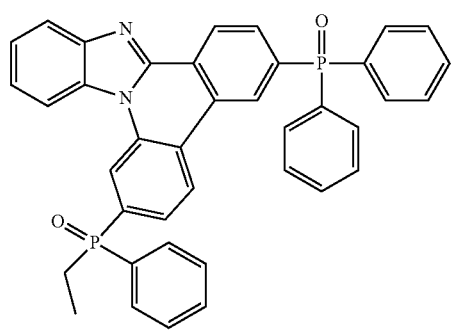
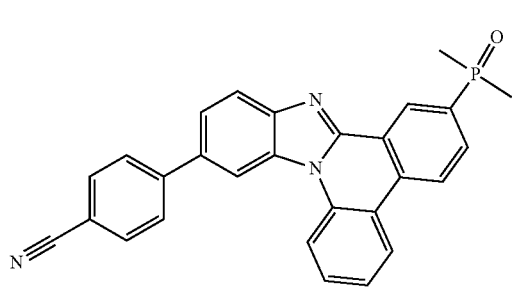
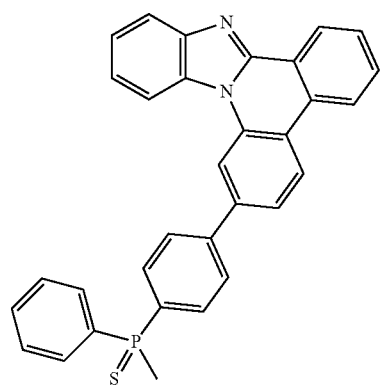
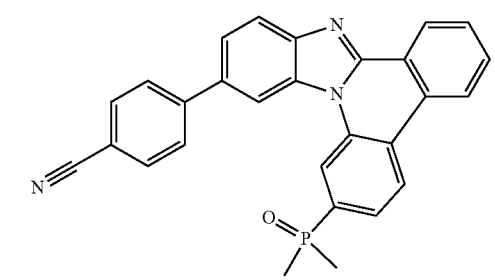
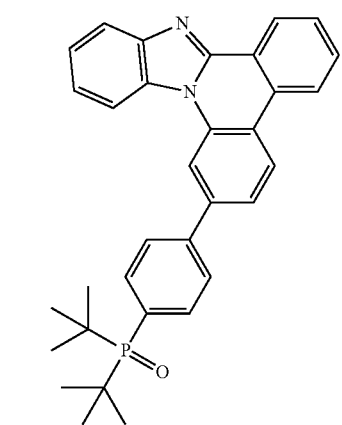
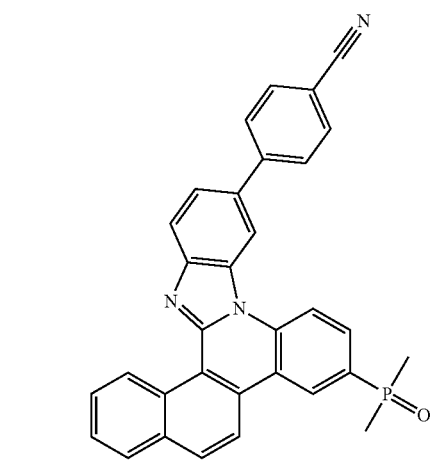

-continued

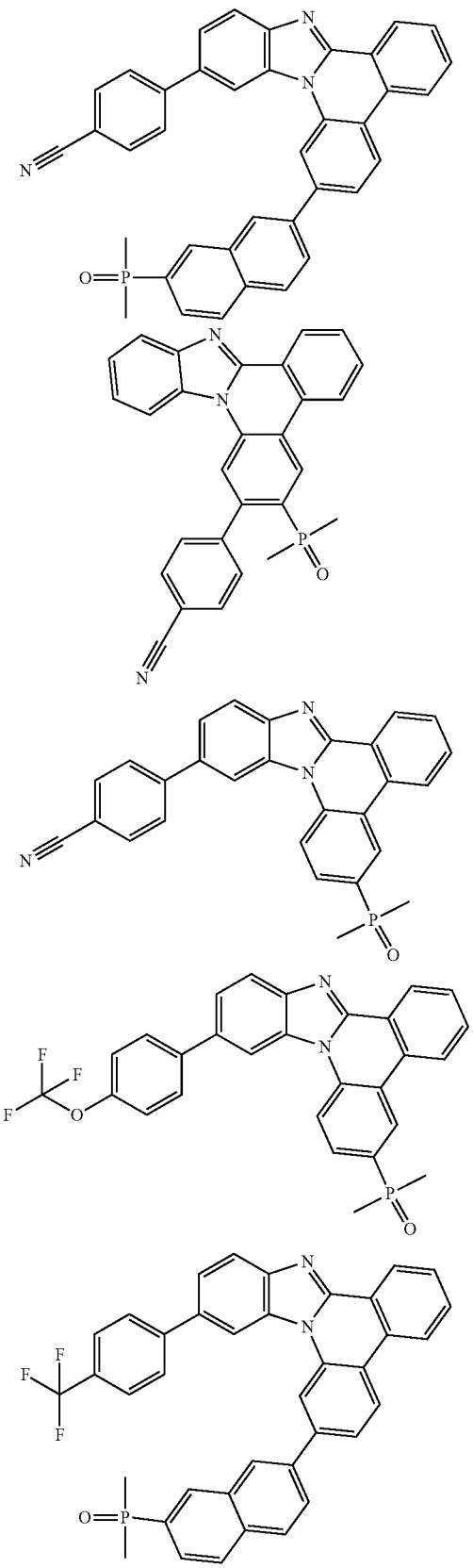

-continued

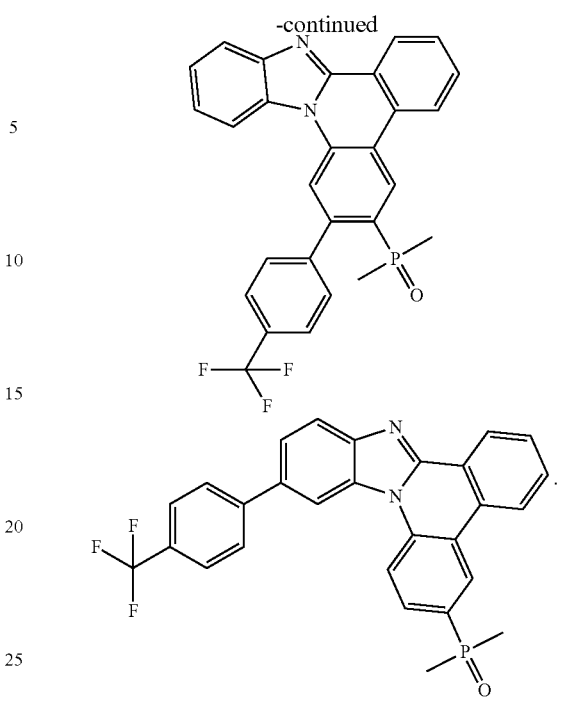

One embodiment of the present specification provides an organic light emitting device comprising the heterocyclic compound described above.

According to one embodiment of the present specification, the organic light emitting device comprises a first electrode; a second electrode provided opposite to the first electrode; and one or more organic material layers provided between the first electrode and the second electrode, wherein one or more layers of the organic material layers comprise the heterocyclic compound of Chemical Formula 1.

The organic material layer of the organic light emitting device of the present specification can be formed in a single layer structure, but can also be formed in a multilayer structure in which two or more organic material layers are laminated. For example, the organic light emitting device of the present disclosure can have a structure comprising a hole injection layer, a hole transfer layer, a hole control layer, an electron blocking layer, a light emitting layer, a hole blocking layer, an electron control layer, an electron transfer layer, an electron injection layer and the like as the organic material layer. However, the structure of the organic light emitting device is not limited thereto, and can comprise less numbers of organic material layers.

For example, the organic light emitting device of the present specification can have structures as illustrated in FIG. 1 and FIG. 2, however, the structure is not limited thereto.

FIG. 1 illustrates a structure of the organic light emitting device (10) in which a first electrode (30), a light emitting layer (40) and a second electrode (50) are consecutively laminated on a substrate (20). FIG. 1 is an exemplary structure of an organic light emitting device according to one embodiment of the present specification, and other organic material layers can be further included.

FIG. 2 illustrates a structure of the organic light emitting device in which a first electrode (30), a hole injection layer (60), a hole transfer layer (70), a light emitting layer (40), an electron transfer layer (80), an electron injection layer (90) and a second electrode (50) are consecutively laminated on a substrate (20). FIG. 2 is an exemplary structure of an organic light emitting device according to an embodiment of the present specification, and other organic material layers can be further included.

According to one embodiment of the present specification, the organic material layer comprises an electron transfer layer, an electron injection layer, or a layer carrying out electron transfer and electron injection at the same time, and the electron transfer layer, the electron injection layer, or the layer carrying out electron transfer and electron injection at the same time comprises the heterocyclic compound.

According to one embodiment of the present specification, the organic material layer comprises an electron transfer layer, and the electron transfer layer comprises the heterocyclic compound.

According to one embodiment of the present specification, the organic material layer comprises an electron injection layer, and the electron injection layer comprises the heterocyclic compound.

According to one embodiment of the present specification, the organic material layer comprises a layer carrying out electron transfer and electron injection at the same time, and the layer carrying out electron transfer and electron injection at the same time comprises the heterocyclic compound.

According to one embodiment of the present specification, the organic material layer comprises a hole blocking layer, and the hole blocking layer comprises the heterocyclic compound.

According to one embodiment of the present specification, the organic material layer comprises an electron control layer, and the electron control layer comprises the heterocyclic compound.

According to one embodiment of the present specification, the organic material layer further comprises a hole injection layer or a hole transfer layer comprising a compound comprising an arylamino group, a carbazole group or a benzocarbazole group in addition to the organic material layer comprising the heterocyclic compound of Chemical Formula 1.

The organic light emitting device of the present specification can be manufactured using materials and methods known in the art, except that one of more layers of the organic material layers comprise the heterocyclic compound of the present specification, that is, the heterocyclic compound of Chemical Formula 1.

When the organic light emitting device comprises a plurality of organic material layers, the organic material layers can be formed with the same material or with different materials.

For example, the organic light emitting device of the present specification can be manufactured by consecutively laminating a first electrode, an organic material layer and a second electrode on a substrate. Herein, the organic light emitting device can be manufactured by forming the first electrode on the substrate by depositing a metal, a metal oxide having conductivity, or an alloy thereof using a physical vapor deposition (PVD) method such as a sputtering method or an e-beam evaporation method, forming the organic material layer comprising a hole injection layer, a hole transfer layer, a light emitting layer and an electron transfer layer thereon, and then depositing a material usable as the second electrode thereon. In addition to this method, the organic light emitting device can be manufactured by consecutively depositing a cathode material, an organic material layer and a first electrode material on a substrate. In addition, the heterocyclic compound of Chemical Formula 1 can be formed into the organic material layer using a solution coating method as well as a vacuum deposition method when manufacturing the organic light emitting device. Herein, the solution coating method means spin coating, dip coating, doctor blading, ink jet printing, screen printing, a spray method, roll coating and the like, but is not limited thereto.

In addition to such methods, the organic light emitting device can also be manufactured by consecutively depositing a cathode material, an organic material layer and an anode material on a substrate (International Patent Application Publication No. WO2003/012890). However, the manufacturing method is not limited thereto.

According to one embodiment of the present specification, the first electrode is an anode, and the second electrode is a cathode.

According to another embodiment of the present specification, the first electrode is a cathode, and the second electrode is an anode.

As the anode material, materials having large work function are normally preferred so that hole injection to an organic material layer is smooth. Specific examples of the anode material usable in the present disclosure comprise metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or SnO$_2$:Sb; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Specific examples of the cathode material comprise metals such as magnesium, calcium, sodium, potassium, titanium, indium, yttrium, lithium, gadolinium, aluminum, silver, tin and lead, or alloys thereof; multilayer structure materials such as LiF/Al, LiO$_2$/Al or Mg/Ag, and the like, but are not limited thereto.

The hole injection layer is a layer that injects holes from an electrode, and the hole injection material is preferably a compound that has an ability to transfer holes, therefore, has a hole injection effect in an anode, has an excellent hole injection effect for a light emitting layer or a light emitting material, prevents excitons generated in the light emitting layer from moving to an electron injection layer or an electron injection material, and in addition thereto, has an excellent thin film forming ability. The highest occupied molecular orbital (HOMO) of the hole injection material is preferably in between the work function of an anode material and the HOMO of surrounding organic material layers. Specific examples of the hole injection material comprise metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer that receives holes from a hole injection layer and transfers the holes to a light emitting layer, and as the hole transfer material, materials capable of receiving holes from an anode or a hole injection layer, moving the holes to a light emitting layer, and having high mobility for the holes are suited. Specific examples thereof comprise arylamine-based organic materials, conductive polymers, block copolymers having conjugated parts and non-conjugated parts together, and the like, but are not limited thereto.

The electron blocking layer is a layer preventing electrons injected from an electron injection layer entering a hole injection layer after passing through a light emitting layer, and thereby capable of enhancing lifetime and efficiency of a device, and can be formed when necessary in a proper place between the light emitting layer and the hole injection layer using known materials.

The light emitting material of the light emitting layer is a material capable of emitting light in a visible region by receiving holes and electrons from a hole transfer layer and an electron transfer layer, respectively, and binding the holes and the electrons, and is preferably a material having favorable quantum efficiency for fluorescence or phosphorescence. Specific examples thereof comprise 8-hydroxy-quinoline aluminum complexes ($Alq_3$), carbazole series compounds, dimerized styryl compounds, BAlq, 10-hydroxybenzoquinoline-metal compounds, benzoxazole, benzothiazole and benzimidazole series compounds, poly(p-phenylenevinylene) (PPV) series polymers, spiro compounds, polyfluorene, rubrene, and the like, but are not limited thereto.

The light emitting layer can comprise a host material and a dopant material. The host material can comprise fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like can be included, and as the heteroring-containing compound, carbazole derivatives, dibenzofuran derivatives, ladder-type furan compounds, pyrimidine derivatives and the like can be included, however, the host material is not limited thereto.

The dopant material can comprise aromatic amine derivatives, styrylamine compounds, boron complexes, fluoranthene compounds, metal complexes and the like. Specifically, the aromatic amine derivative is a fused aromatic ring derivative having a substituted or unsubstituted arylamino group, and arylamino group—comprising pyrene, anthracene, chrysene, peryflanthene and the like can be included. The styrylamine compound is a compound in which substituted or unsubstituted arylamine is substituted with at least one arylvinyl group, and one, two or more substituents selected from the group consisting of an aryl group, a silyl group, an alkyl group, a cycloalkyl group and an arylamino group can be substituted or unsubstituted. Specifically, styrylamine, styryldiamine, styryltriamine, styryltetramine and the like can be included, however, the styrylamine compound is not limited thereto. As the metal complex, iridium complexes, platinum complexes and the like can be included, however, the metal complex is not limited thereto.

The electron transfer layer is a layer that receives electrons from an electron injection layer and transfers the electrons to a light emitting layer, and as the electron transfer material, materials capable of favorably receiving electrons from a cathode, moving the electrons to a light emitting layer, and having high mobility for the electrons are suited. Specific examples thereof comprise Al complexes of 8-hydroxyquinoline, complexes comprising $Alq_3$, organic radical compounds, hydroxyflavon-metal complexes, and the like, but are not limited thereto. The electron transfer layer can be used together with any desired cathode material as used in the art. Particularly, examples of the suitable cathode material comprise common materials that have small work function, and in which an aluminum layer or a silver layer follows. Specifically, the cathode material comprises cesium, barium, calcium, ytterbium and samarium, and in each case, an aluminum layer or a silver layer follows.

The electron injection layer is a layer that injects electrons from an electrode, and as the electron injection material, compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film forming ability are preferred. Specific examples thereof comprise fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound comprises 8-hydroxyquinolinato lithium, bis(8-hydroxyquinolinato)zinc, bis(8-hydroxy-quinolinato)copper, bis(8-hydroxyquinolinato)manganese, tris(8-hydroxyquinolinato)aluminum, tris(2-methyl-8-hydroxy-quinolinato)aluminum, tris(8-hydroxyquinolinato)-gallium, bis(10-hydroxybenzo[h]quinolinato)berylium, bis(10-hydroxybenzo[h]quinolinato)zinc, bis(2-methyl-8-quinolinato)-chloro-gallium, bis(2-methyl-8-quinolinato)(o-cresolato)-gallium, bis(2-methyl-8-quinolinato) (1-naphtholato)aluminum, bis(2-methyl-8-quinolinato) (2-naphtholato)gallium and the like, but is not limited thereto.

The hole blocking layer is a layer preventing holes injected from a hole injection layer entering an electron injection layer after passing through a light emitting layer, and thereby capable of enhancing lifetime and efficiency of a device, and can be formed when necessary in a proper place between the light emitting layer and the electron injection layer using known materials.

The organic light emitting device according to the present specification can be a top-emission type, a bottom-emission type or a dual-emission type depending on the materials used.

According to one embodiment of the present specification, the heterocyclic compound of Chemical Formula 1 can be included in an organic solar cell or an organic transistor in addition to an organic light emitting device.

EXAMPLES

Hereinafter, the present specification will be described in detail with reference to examples. However, the examples according to the present specification can be modified to various other forms, and the scope of the present specification is not to be construed as being limited to the examples described below. Examples of the present specification are provided in order to more fully describe the present specification to those having average knowledge in the art.

Preparation Example

Preparation Example 1. Preparation of Compound 1

[Chemical Formula 1A]

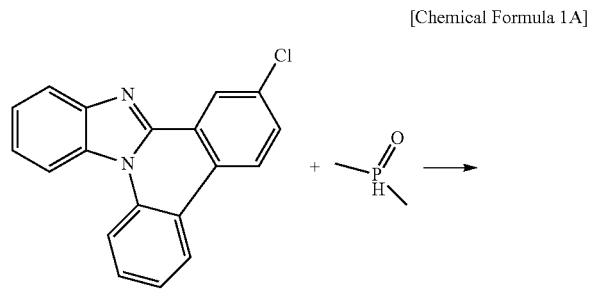

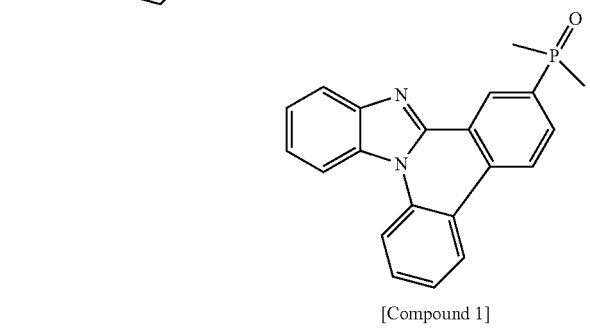

[Compound 1]

Chemical Formula 1A (15 g, 49.7 mmol), dimethylphosphine oxide (3.87 g, 49.7 mmol) and cesium carbonate (Cs$_2$CO$_3$) (48.6 g, 149.1 mmol) were dissolved in dioxane-methyl pyrrolidone (NMP) (500 mL), and heated to 130° C. After adding a nickel catalyst (Ni(dppp)Cl$_2$) (1.35 g, 2.49 mmol) thereto, the result was refluxed for 4 hours. The result was cooled to room temperature, and the water layer was removed. Magnesium sulfate (MgSO$_4$) was introduced to the organic layer, and then filtered. The filtrate was concentrated and then purified using column chromatography to obtain Compound 1 (15 g, yield 88%).

MS: [M+H]$^+$=344

Preparation Example 2. Preparation of Compound 2

[Chemical Formula 1B]

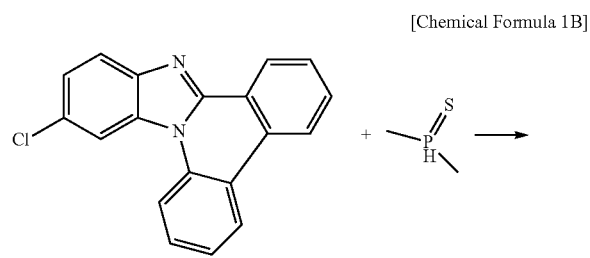

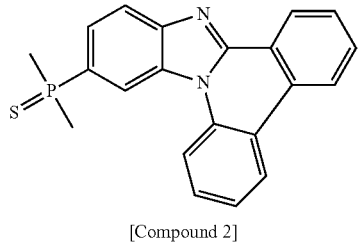

[Compound 2]

Chemical Formula 1B (15 g, 49.7 mmol), dimethylphosphine sulfide (4.67 g, 49.7 mmol) and cesium carbonate (Cs$_2$CO$_3$) (48.6 g, 149.1 mmol) were dissolved in dioxane-methyl pyrrolidone (NMP) (500 mL), and heated to 130° C. After adding a nickel catalyst (Ni(dppp)Cl$_2$) (1.35 g, 2.49 mmol) thereto, the result was refluxed for 4 hours. The result was cooled to room temperature, and the water layer was removed. Magnesium sulfate (MgSO$_4$) was introduced to the organic layer, and then filtered. The filtrate was concentrated and then purified using column chromatography to obtain Compound 2 (14 g, yield 78%).

MS: [M+H]$^+$=360

Preparation Example 3. Preparation of Compound 3

[Chemical Formula 1C]

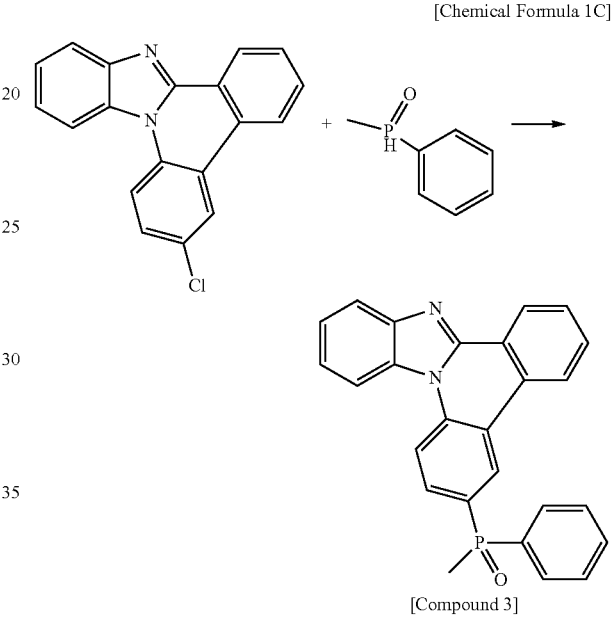

[Compound 3]

Chemical Formula 1C (15 g, 49.7 mmol), methyl-phenylphosphine oxide (6.96 g, 49.7 mmol) and cesium carbonate (Cs$_2$CO$_3$) (48.6 g, 149.1 mmol) were dissolved in dioxane-methyl pyrrolidone (NMP) (1:1, 500 mL), and heated to 130° C. After adding a nickel catalyst (Ni(dppp)Cl$_2$) (1.35 g, 2.49 mmol) thereto, the result was refluxed for 4 hours. The result was cooled to room temperature, and the water layer was removed. Magnesium sulfate (MgSO$_4$) was introduced to the organic layer, and then filtered. The filtrate was concentrated and then purified using column chromatography to obtain Compound 3 (17 g, yield 84%).

MS: [M+H]$^+$=406

Preparation Example 4. Preparation of Compound 4

[Chemical Formula 1D]

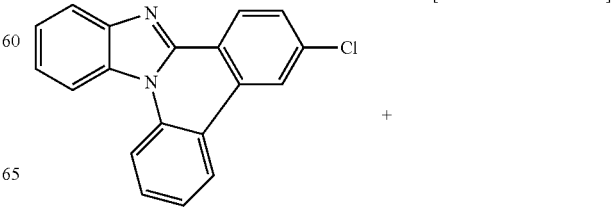

+

-continued

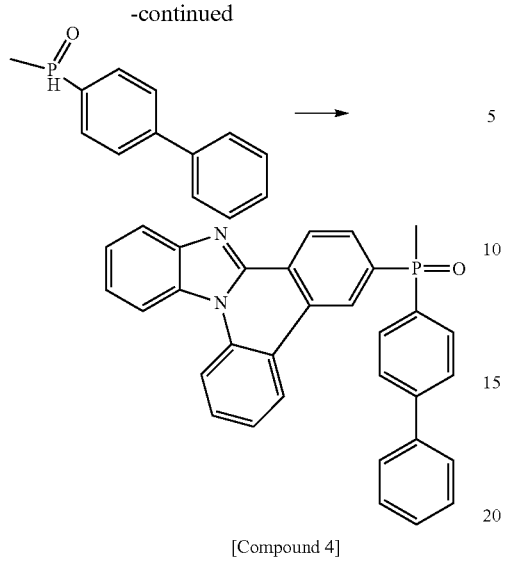

[Compound 4]

Chemical Formula 1D (15 g, 49.7 mmol), methyl-biphenylphosphine oxide (6.96 g, 49.7 mmol) and cesium carbonate ($Cs_2CO_3$) (48.6 g, 149.1 mmol) were dissolved in dioxane-methyl pyrrolidone (NMP) (1:1, 500 mL), and heated to 130° C. After adding a nickel catalyst (Ni(dppp)$Cl_2$) (1.35 g, 2.49 mmol) thereto, the result was refluxed for 4 hours. The result was cooled to room temperature, and the water layer was removed. Magnesium sulfate ($MgSO_4$) was introduced to the organic layer, and then filtered. The filtrate was concentrated and then purified using column chromatography to obtain Compound 4 (17 g, yield 84%).

MS: $[M+H]^+=406$

Preparation Example 5. Preparation of Compound 5

[Chemical Formula 1C]

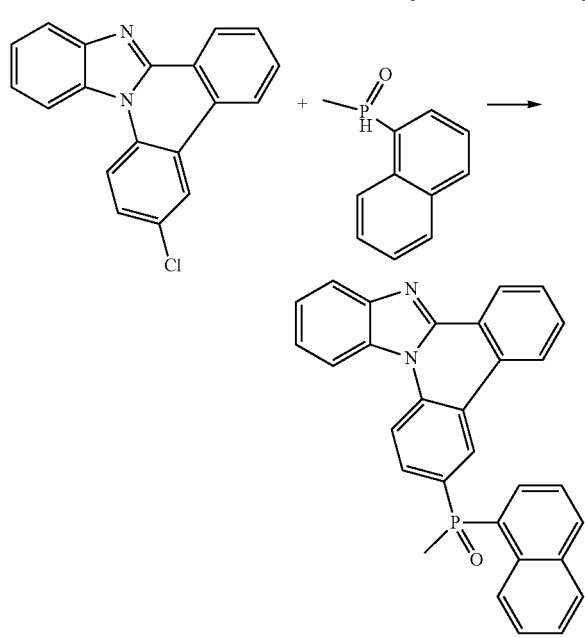

[Compound 5]

Chemical Formula 1C (15 g, 49.7 mmol), methyl-naphthylphosphine oxide (9.44 g, 49.7 mmol) and cesium carbonate ($Cs_2CO_3$) (48.6 g, 149.1 mmol) were dissolved in dioxane-methyl pyrrolidone (NMP) (1:1, 500 mL), and heated to 130° C. After adding a nickel catalyst (Ni(dppp)$Cl_2$) (1.35 g, 2.49 mmol) thereto, the result was refluxed for 4 hours. The result was cooled to room temperature, and the water layer was removed. Magnesium sulfate ($MgSO_4$) was introduced to the organic layer, and then filtered. The filtrate was concentrated and then purified using column chromatography to obtain Compound 5 (15 g, yield 66%).

MS: $[M+H]^+=456$

Preparation Example 6. Preparation of Compound 6

[Chemical Formula 1E]

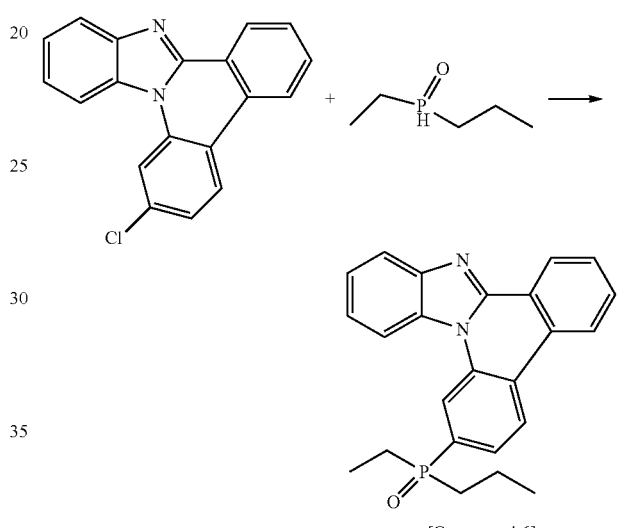

[Compound 6]

Chemical Formula 1E (15 g, 49.7 mmol), ethyl-propylphosphine oxide (5.96 g, 49.7 mmol) and cesium carbonate ($Cs_2CO_3$) (48.6 g, 149.1 mmol) were dissolved in dioxane-methyl pyrrolidone (NMP) (1:1, 500 mL), and heated to 130° C. After adding a nickel catalyst (Ni(dppp)$Cl_2$) (1.35 g, 2.49 mmol) thereto, the result was refluxed for 4 hours. The result was cooled to room temperature, and the water layer was removed. Magnesium sulfate ($MgSO_4$) was introduced to the organic layer, and then filtered. The filtrate was concentrated and then purified using column chromatography to obtain Compound 6 (13 g, yield 68%).

MS: $[M+H]^+=386$

Preparation Example 7. Preparation of Compound 7

Chemical Formula 1B]

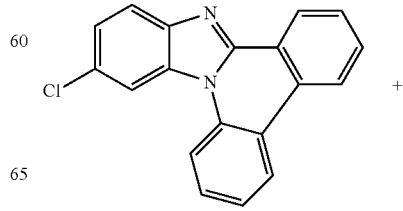

+

-continued

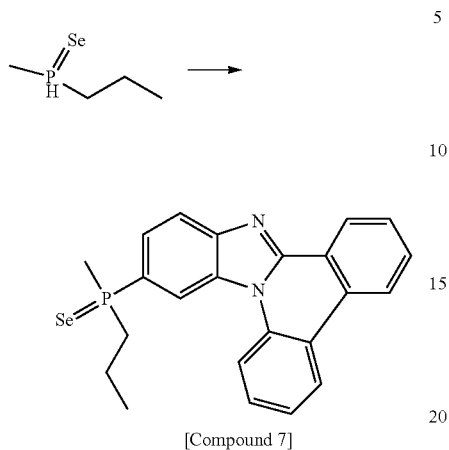

[Compound 7]

Compound 7 (18 g, yield 83%) was obtained in the same manner as in Preparation Example 2 except that methyl-propylphosphine selenium was used instead of dimethylphosphine sulfide.

MS: $[M+H]^+=435$

Preparation Example 8. Preparation of Compound 8

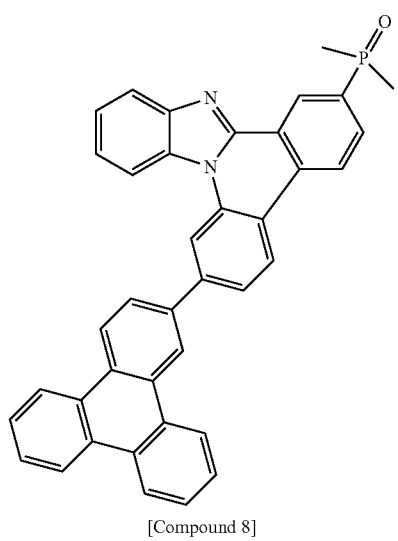

[Compound 8]

Compound 8 (21 g, yield 74%) was obtained in the same manner as in Preparation Example 1 except that Chemical Formula 2A was used instead of Chemical Formula 1A.

MS: $[M+H]^+=570$

Preparation Example 9. Preparation of Compound 9

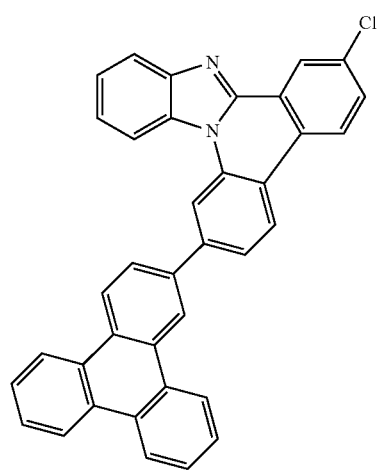

[Chemical Formula 2A]

+

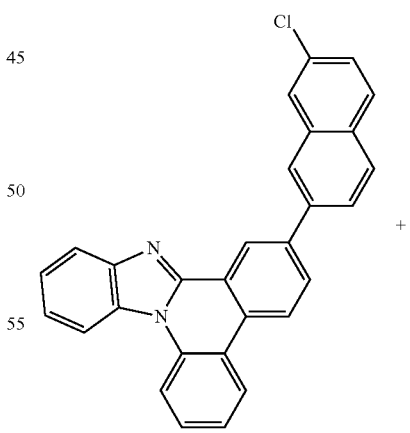

[Chemical Formula 3A]

+

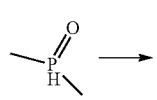

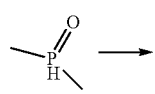

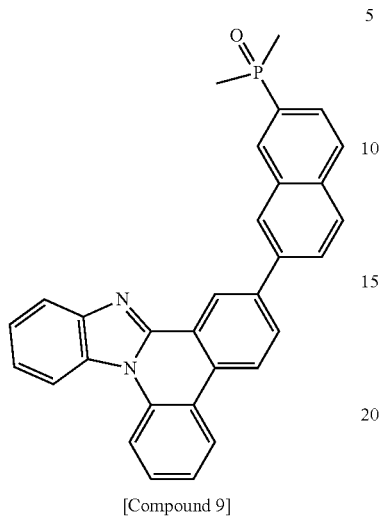

[Compound 9]

Compound 9 (19 g, yield 81%) was obtained in the same manner as in Preparation Example 1 except that Chemical Formula 3A was used instead of Chemical Formula 1A.

MS: [M+H]$^+$=470

Preparation Example 10. Preparation of Compound 10

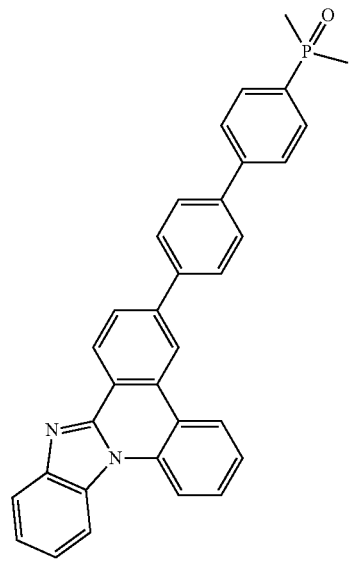

[Compound 10]

Compound 10 (19 g, yield 77%) was obtained in the same manner as in Preparation Example 1 except that Chemical Formula 2D was used instead of Chemical Formula 1A.

MS: [M+H]$^+$=496

Preparation Example 11. Preparation of Compound 11

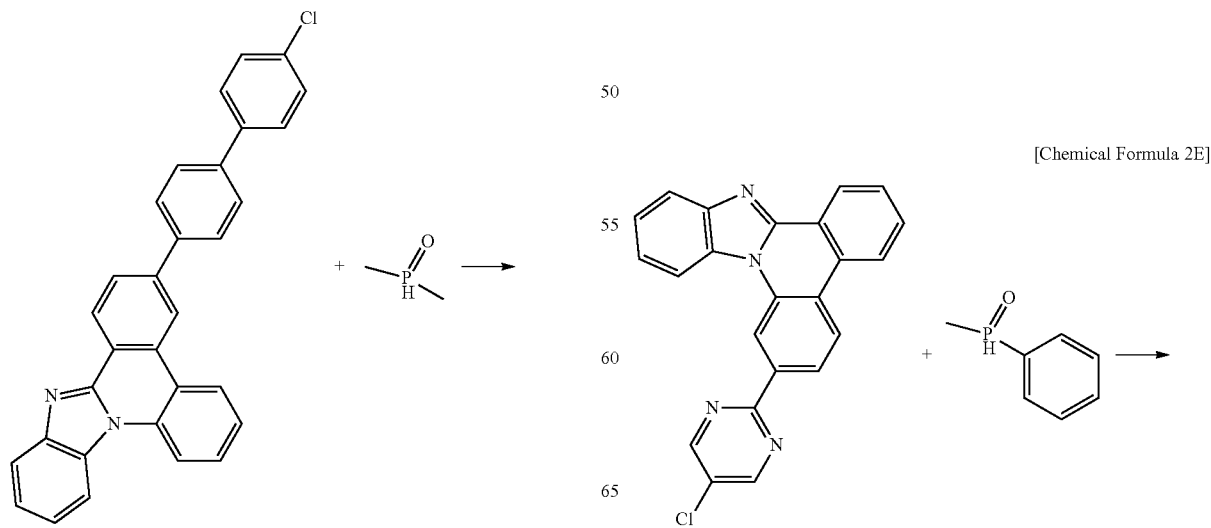

[Chemical Formula 2D]

[Chemical Formula 2E]

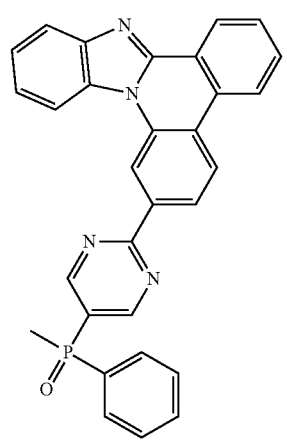

[Compound 11]

Compound 11 (16 g, yield 67%) was obtained in the same manner as in Preparation Example 3 except that Chemical Formula 2E was used instead of Chemical Formula 1C.

MS: [M+H]$^+$=484

Preparation Example 12. Preparation of Compound 12

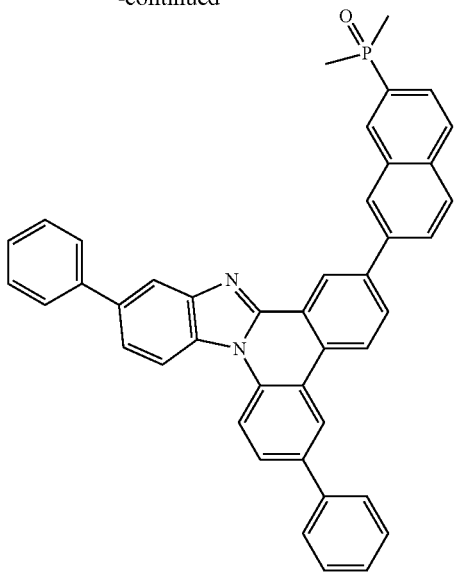

[Compound 12]

Compound 12 (23 g, yield 74%) was obtained in the same manner as in Preparation Example 1 except that Chemical Formula 4A was used instead of Chemical Formula 1A.

MS: [M+H]$^+$=622

Preparation Example 13. Preparation of Compound 13

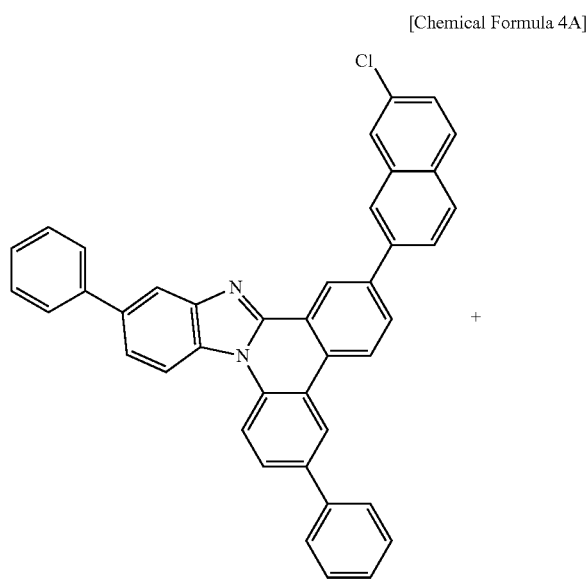

[Chemical Formula 4A]

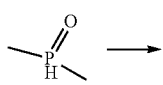

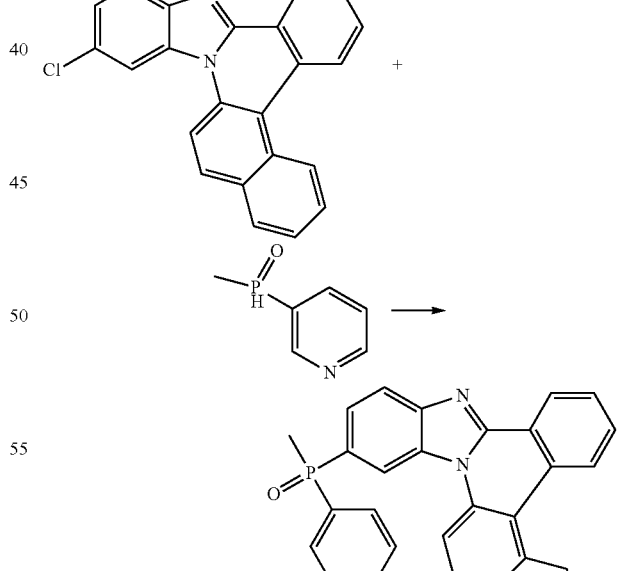

[Chemical Formula 2B]

[Compound 13]

Compound 13 (15 g, yield 66%) was obtained in the same manner as in Preparation Example 1 except that Chemical Formula 2B was used instead of Chemical Formula 1A, and methylpyridinephosphine oxide was used instead of dimethylphosphine oxide.

MS: [M+H]$^+$=457

Preparation Example 14. Preparation of Compound 14

[Chemical Formula 3E]

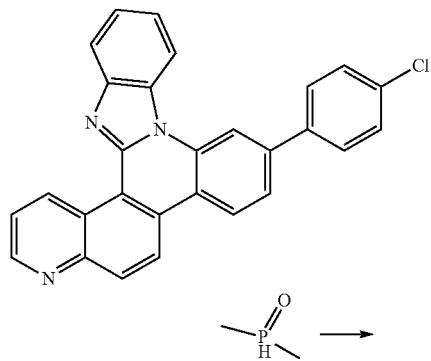

+

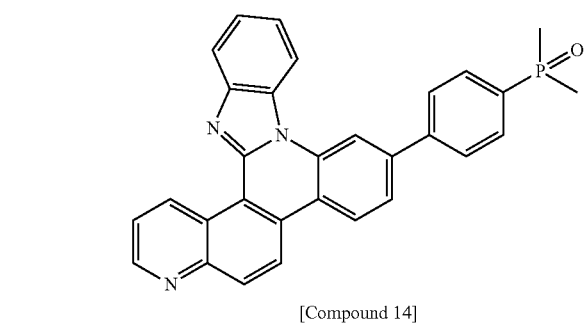

[Compound 14]

Compound 14 (19 g, yield 81%) was obtained in the same manner as in Preparation Example 1 except that Chemical Formula 3E was used instead of Chemical Formula 1A.

MS: [M+H]$^+$=471

Preparation Example 15. Preparation of Compound 15

[Chemical Formula 1F]

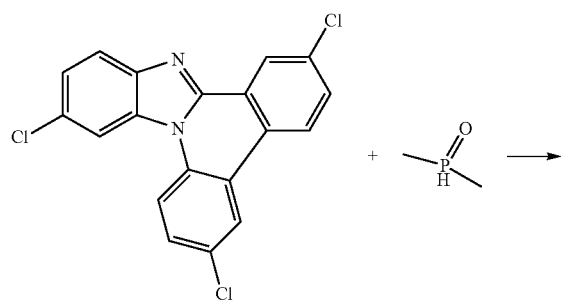

+

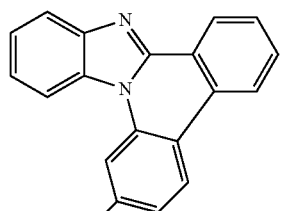

→

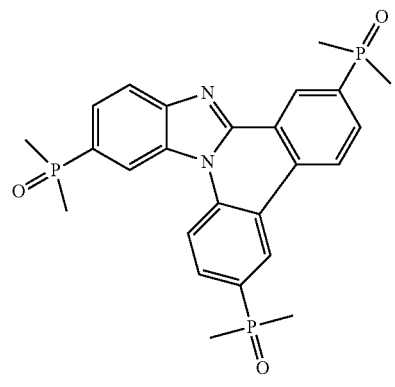

[Compound 15]

Chemical Formula 1F (18.4 g, 49.7 mmol), dimethylphosphine oxide (17.9 g, 149.1 mmol) and cesium carbonate (Cs$_2$CO$_3$) (145.8 g, 447.3 mmol) were dissolved in dioxane-methyl pyrrolidone (NMP) (1:1, 1500 mL), and heated to 130° C. After adding a nickel catalyst (Ni(dppp)Cl$_2$) (4.05 g, 7.47 mmol) thereto, the result was refluxed for 4 hours. The result was cooled to room temperature, and the water layer was removed. Magnesium sulfate (MgSO$_4$) was introduced to the organic layer, and then filtered. The filtrate was concentrated and then purified using column chromatography to obtain Compound 15 (18 g, yield 73%).

MS: [M+H]$^+$=496

Preparation Example 16. Preparation of Compound 16

[Chemical Formula 4E]

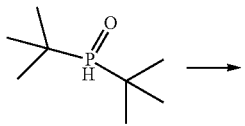 +

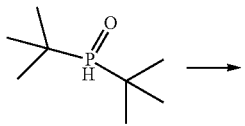 →

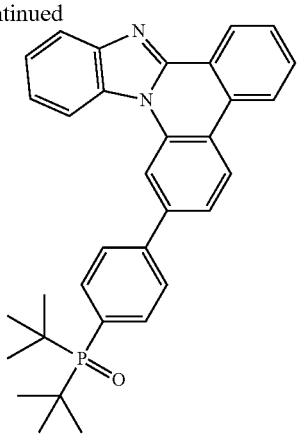

[Compound 16]

Compound 16 (17 g, yield 68%) was obtained in the same manner as in Preparation Example 1 except that Chemical Formula 4E was used instead of Chemical Formula 1A, and di-tert-butylphosphine oxide was used instead of dimethylphosphine oxide.

MS: [M+H]$^+$=504

Preparation Example 17. Preparation of Compound 17

[Chemical Formula 5E]

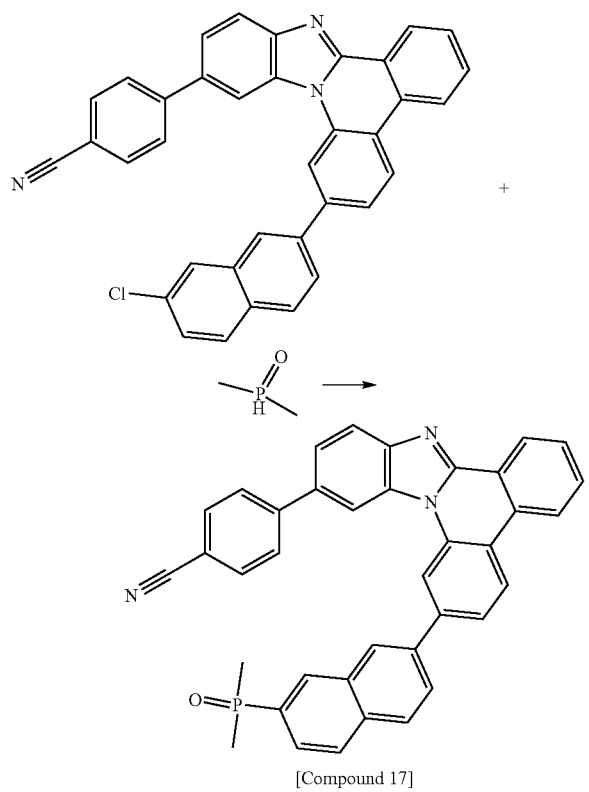

[Compound 17]

Compound 17 (20 g, yield 71%) was obtained in the same manner as in Preparation Example 1 except that Chemical Formula 5E was used instead of Chemical Formula 1A.

MS: [M+H]$^+$=571

Preparation Example 18. Preparation of Compound 18

[Chemical Formula 6E]

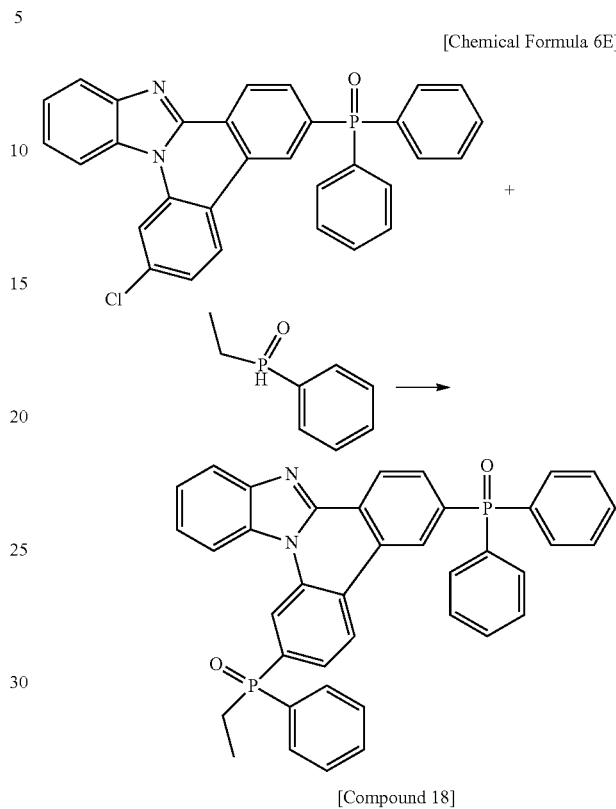

[Compound 18]

Compound 18 (23 g, yield 75%) was obtained in the same manner as in Preparation Example 1 except that Chemical Formula 6E was used instead of Chemical Formula 1A, and ethyl-phenylphosphine oxide was used instead of dimethylphosphine oxide.

MS: [M+H]$^+$=620

Manufacture of Organic Light Emitting Device

Example 1

A glass substrate (corning 7059 glass) on which indium tin oxide (ITO) was coated as a thin film to a thickness of 1,000 Å was placed in distilled water containing a detergent and ultrasonically cleaned. A product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonically cleaned with solvents of isopropyl alcohol, acetone and methanol in this order, then dried.

On the transparent ITO electrode prepared as above, a hole injection layer was formed by thermal vacuum depositing hexanitrile hexaazatriphenylene to a thickness of 500 Å. After vacuum depositing HT1 (400 Å) shown below, a material transferring holes, thereon, host H1 shown below and dopant D1 shown below were vacuum deposited to a thickness of 300 Å as a light emitting layer. On the light emitting layer, Compound 1 prepared in Preparation Example 1 and lithium quinolate (LiQ) were vacuum deposited in a weight ratio of 1:1 to a thickness of 350 Å to form a layer carrying out electron injection and transfer at the same time. On the electron injection and transfer layer, a cathode was formed by consecutively depositing lithium fluoride (LiF) to a thickness of 12 Å and aluminum to a thickness of 2,000 Å, and an organic light emitting device was manufactured.

In the above-described process, the deposition rates of the organic materials were maintained at 0.4 Å/sec to 0.7 Å/sec, the deposition rates of the lithium fluoride and the aluminum of the cathode were maintained at 0.3 Å/sec and 2 Å/sec, respectively, and the degree of vacuum during the deposition was maintained at $2 \times 10^{-7}$ torr to $5 \times 10^{-6}$ torr to manufacture the organic light emitting device.

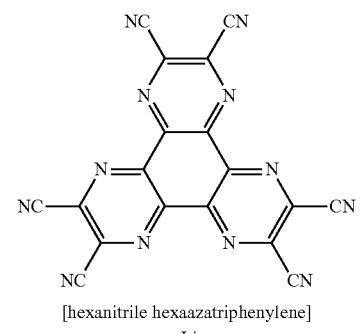

[hexanitrile hexaazatriphenylene]

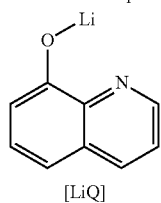

[LiQ]

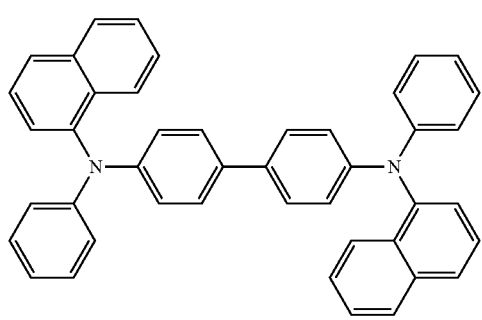

[HT1]

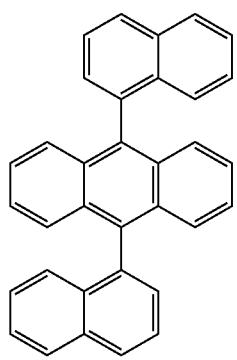

[H1]

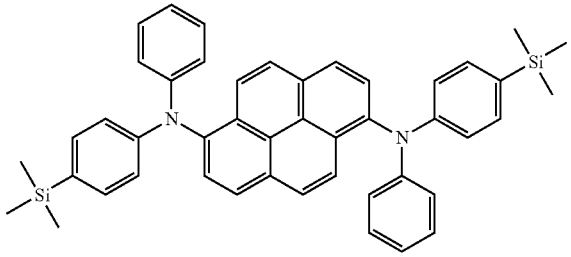

[D1]

Example 2

An experiment was performed in the same manner as in Example 1 except that Compound 2 was used instead of Compound 1 as the layer carrying out electron injection and transfer at the same time.

Example 3

An experiment was performed in the same manner as in Example 1 except that Compound 3 was used instead of Compound 1 as the layer carrying out electron injection and transfer at the same time.

Example 4

An experiment was performed in the same manner as in Example 1 except that Compound 4 was used instead of Compound 1 as the layer carrying out electron injection and transfer at the same time.

Example 5

An experiment was performed in the same manner as in Example 1 except that Compound 5 was used instead of Compound 1 as the layer carrying out electron injection and transfer at the same time.

Example 6

An experiment was performed in the same manner as in Example 1 except that Compound 6 was used instead of Compound 1 as the layer carrying out electron injection and transfer at the same time.

Example 7

An experiment was performed in the same manner as in Example 1 except that Compound 7 was used instead of Compound 1 as the layer carrying out electron injection and transfer at the same time.

Example 8

An experiment was performed in the same manner as in Example 1 except that Compound 8 was used instead of Compound 1 as the layer carrying out electron injection and transfer at the same time.

Example 9

An experiment was performed in the same manner as in Example 1 except that Compound 9 was used instead of Compound 1 as the layer carrying out electron injection and transfer at the same time.

Example 10

An experiment was performed in the same manner as in Example 1 except that Compound 10 was used instead of Compound 1 as the layer carrying out electron injection and transfer at the same time.

Example 11

An experiment was performed in the same manner as in Example 1 except that Compound 11 was used instead of Compound 1 as the layer carrying out electron injection and transfer at the same time.

Example 12

An experiment was performed in the same manner as in Example 1 except that Compound 12 was used instead of Compound 1 as the layer carrying out electron injection and transfer at the same time.

Example 13

An experiment was performed in the same manner as in Example 1 except that Compound 13 was used instead of Compound 1 as the layer carrying out electron injection and transfer at the same time.

Example 14

An experiment was performed in the same manner as in Example 1 except that Compound 14 was used instead of Compound 1 as the layer carrying out electron injection and transfer at the same time.

Example 15

An experiment was performed in the same manner as in Example 1 except that Compound 15 was used instead of Compound 1 as the layer carrying out electron injection and transfer at the same time.

Example 16

An experiment was performed in the same manner as in Example 1 except that Compound 16 was used instead of Compound 1 as the layer carrying out electron injection and transfer at the same time.

Example 17

An experiment was performed in the same manner as in Example 1 except that Compound 17 was used instead of Compound 1 as the layer carrying out electron injection and transfer at the same time.

Example 18

An experiment was performed in the same manner as in Example 1 except that Compound 18 was used instead of Compound 1 as the layer carrying out electron injection and transfer at the same time.

Comparative Example 1

An experiment was performed in the same manner as in Example 1 except that the following compound of ET1 was used instead of Compound 1 as the layer carrying out electron injection and transfer at the same time.

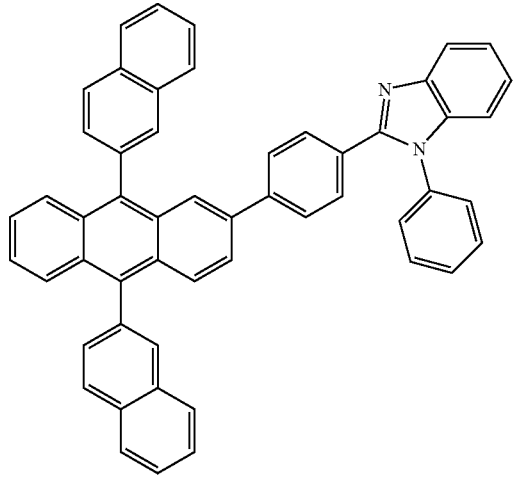

[ET1]

Comparative Example 2

An experiment was performed in the same manner as in Example 1 except that the following compound of ET2 was used instead of Compound 1 as the layer carrying out electron injection and transfer at the same time.

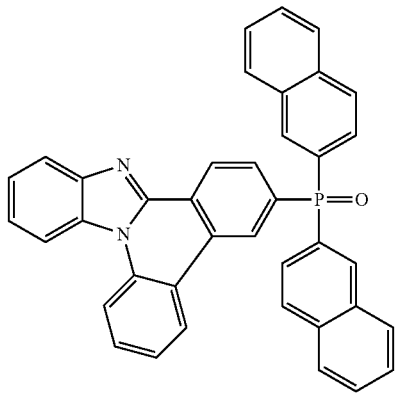

[ET2]

Comparative Example 3

An experiment was performed in the same manner as in Example 1 except that the following compound of ET3 was used instead of Compound 1 as the layer carrying out electron injection and transfer at the same time.

[ET3]

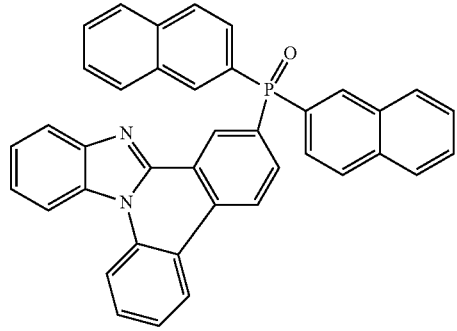

Comparative Example 4

An experiment was performed in the same manner as in Example 1 except that the following compound of ET4 was used instead of Compound 1 as the layer carrying out electron injection and transfer at the same time.

[ET4]

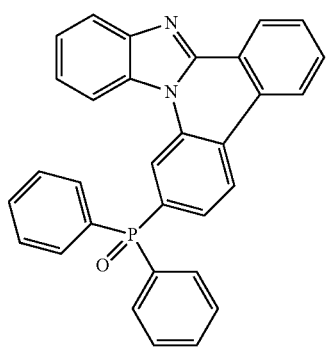

Comparative Example 5

An experiment was performed in the same manner as in Example 1 except that the following compound of ET5 was used instead of Compound 1 as the layer carrying out electron injection and transfer at the same time.

[ET5]

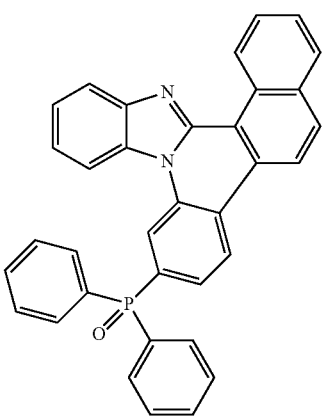

Evaluation on Device

For the organic light emitting devices of Examples 1 to 18 and Comparative Example 1 to Comparative Example 5, driving voltage and light emission efficiency were measured at current density of 10 mA/cm$^2$, and time taken for the luminance decreasing to 98% compared to its initial luminance (LT98) was measured at current density of 20 mA/cm$^2$. The results are shown in the following Table 1.

TABLE 1

| | Compound | Voltage (V) | Current Efficiency (cd/A) | Color Coordinate (x, y) | Lifetime 98 at 20 mA/cm$^2$ |
|---|---|---|---|---|---|
| Example 1 | Compound 1 | 3.88 | 5.30 | (0.137, 0.124) | 63 |
| Example 2 | Compound 2 | 3.91 | 5.25 | (0.139, 0.124) | 59 |
| Example 3 | Compound 3 | 4.05 | 5.18 | (0.138, 0.127) | 78 |
| Example 4 | Compound 4 | 4.08 | 5.11 | (0.138, 0.129) | 83 |
| Example 5 | Compound 5 | 4.07 | 5.15 | (0.137, 0.126) | 77 |
| Example 6 | Compound 6 | 3.82 | 5.28 | (0.137, 0.124) | 55 |
| Example 7 | Compound 7 | 3.85 | 5.21 | (0.137, 0.126) | 51 |
| Example 8 | Compound 8 | 4.01 | 5.45 | (0.137, 0.126) | 58 |
| Example 9 | Compound 9 | 4.02 | 5.21 | (0.137, 0.124) | 56 |
| Example 10 | Compound 10 | 3.99 | 5.18 | (0.137, 0.126) | 54 |
| Example 11 | Compound 11 | 3.81 | 5.05 | (0.137, 0.126) | 79 |
| Example 12 | Compound 12 | 4.10 | 5.24 | (0.138, 0.129) | 77 |
| Example 13 | Compound 13 | 4.05 | 5.07 | (0.137, 0.124) | 79 |
| Example 14 | Compound 14 | 4.08 | 5.10 | (0.137, 0.126) | 79 |
| Example 15 | Compound 15 | 4.12 | 5.01 | (0.137, 0.126) | 85 |
| Example 16 | Compound 16 | 3.80 | 5.35 | (0.137, 0.124) | 50 |
| Example 17 | Compound 17 | 4.14 | 5.01 | (0.137, 0.126) | 89 |
| Example 18 | Compound 18 | 4.10 | 5.05 | (0.137, 0.126) | 80 |
| Comparative Example 1 | ET1 | 4.02 | 5.05 | (0.140, 0.129) | 32 |
| Comparative Example 2 | ET2 | 4.35 | 4.32 | (0.140, 0.129) | 44 |
| Comparative Example 3 | ET3 | 4.24 | 4.90 | (0.139, 0.129) | 41 |

TABLE 1-continued

| | Compound | Voltage (V) | Current Efficiency (cd/A) | Color Coordinate (x, y) | Lifetime 98 at 20 mA/cm² |
|---|---|---|---|---|---|
| Comparative Example 4 | ET4 | 4.17 | 4.71 | (0.137, 0.126) | 36 |
| Comparative Example 5 | ET5 | 4.19 | 4.87 | (0.140, 0.126) | 41 |

In Table 1, it was seen that, Chemical Formula 1 according to one embodiment of the present specification comprises Chemical Formula 2 in which at least one of Ar1 and Ar2 is a substituted or unsubstituted alkyl group as a substituent, and therefore, the organic light emitting devices of Examples 1 to 18 comprising this as a layer carrying out electron injection and transfer at the same time had lower driving voltage, superior current efficiency, and long lifetime properties compared to the organic light emitting devices of Comparative Examples 2 to 5 comprising a compound in which Ar1 and Ar2 are an aryl group as a layer carrying out electron injection and transfer at the same time and the organic light emitting device of Comparative Example 1 comprising ET1, an existing compound.

The invention claimed is:

1. A heterocyclic compound of Chemical Formula 1:

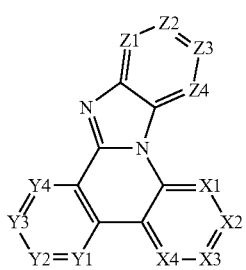

Chemical Formula 1 wherein, in Chemical Formula 1:
X1 is CR1 or N, X2 is CR2 or N, X3 is CR3 or N, X4 is CR4 or N, Y1 is CR5 or N, Y2 is CR6 or N, Y3 is CR7 or N, Y4 is CR8 or N, Z1 is CR9 or N, Z2 is CR10 or N, Z3 is CR11 or N, and Z4 is CR12 or N, wherein X1 to X4, Y1 to Y4 and Z1 to Z4 are not N at the same time; and
at least one of R1 to R12 is a group of the following Chemical Formula 2, and the rest are the same as or different from each other, and each independently is hydrogen, deuterium, a halogen group, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine oxide group, a substituted or unsubstituted aryl group, or a substituted or unsubstituted heteroaryl group, or adjacent groups bond to each other to form a substituted or unsubstituted ring:

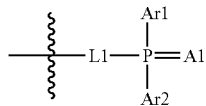

Chemical Formula 2 wherein in Chemical Formula 2:

is a site bonding to Chemical Formula 1;
L1 is a direct bond, a substituted or unsubstituted arylene group, or a substituted or unsubstituted heteroarylene group;
A1 is O, S or Se;
when A1 is O, one of Ar1 and Ar2 is a substituted or unsubstituted alkyl group, and the other is a substituted or unsubstituted aryl group or a substituted or unsubstituted heteroaryl group; and
when A1 is S or Se, one of Ar1 and Ar2 is a substituted or unsubstituted alkyl group, and the other is a substituted or unsubstituted aryl group or a substituted or unsubstituted heteroaryl group.

2. The heterocyclic compound of claim 1, wherein Chemical Formula 1 is the following Chemical Formula 1-1:

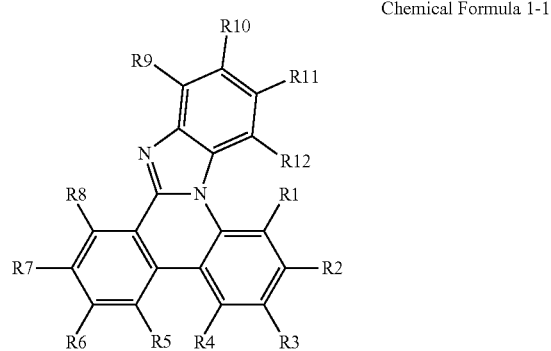

Chemical Formula 1-1 wherein in Chemical Formula 1-1:
R1 to R12 have the same definitions as in Chemical Formula 1.

3. The heterocyclic compound of claim 1, wherein Chemical Formula 1 is the following Chemical Formula 1-2:

Chemical Formula 1-2

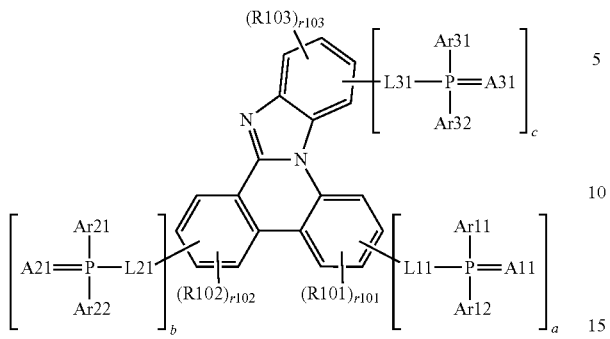

wherein in Chemical Formula 1-2:
L11, L21 and L31 are the same as or different from each other, and each independently is a direct bond, a substituted or unsubstituted arylene group, or a substituted or unsubstituted heteroarylene group,
A11, A21 and A31 are the same as or different from each other, and each independently is O, S or Se;
when A11 is O, one of Ar11 and Ar12 is a substituted or unsubstituted alkyl group, and the other is a substituted or unsubstituted aryl group or a substituted or unsubstituted heteroaryl group, and when A11 is S or Se, one of Ar21 and Ar22 is a substituted or unsubstituted alkyl group, and the other is a substituted or unsubstituted aryl group or a substituted or unsubstituted heteroaryl group;
when A21 is O, one of Ar21 and Ar22 is a substituted or unsubstituted alkyl group, and the other is a substituted or unsubstituted aryl group or a substituted or unsubstituted heteroaryl group, and when A21 is S or Se, one of Ar21 and Ar22 is a substituted or unsubstituted alkyl group, and the other is a substituted or unsubstituted aryl group or a substituted or unsubstituted heteroaryl group;
when A31 is O, one of Ar31 and Ar32 is a substituted or unsubstituted alkyl group, and the other is a substituted or unsubstituted aryl group or a substituted or unsubstituted heteroaryl group, and when A31 is S or Se, one of Ar21 and Ar22 is a substituted or unsubstituted alkyl group, and the other is a substituted or unsubstituted aryl group or a substituted or unsubstituted heteroaryl group;
R101 to R103 are the same as or different from each other, and each independently is hydrogen, deuterium, a halogen group, a cyano group, a nitro group, a hydroxyl group, a carbonyl group, an ester group, an imide group, an amide group, a substituted or unsubstituted alkyl group, a substituted or unsubstituted cycloalkyl group, a substituted or unsubstituted alkoxy group, a substituted or unsubstituted aryloxy group, a substituted or unsubstituted alkylthioxy group, a substituted or unsubstituted arylthioxy group, a substituted or unsubstituted alkylsulfoxy group, a substituted or unsubstituted arylsulfoxy group, a substituted or unsubstituted alkenyl group, a substituted or unsubstituted silyl group, a substituted or unsubstituted boron group, a substituted or unsubstituted amine group, a substituted or unsubstituted arylphosphine oxide group, a substituted or unsubstituted aryl group, or a substituted or unsubstituted heteroaryl group, or adjacent groups bond to each other to form a substituted or unsubstituted ring;

a, b and c are each an integer of 0 to 4;
a+b+c is 1≤a+b+c≤12;
r101, r102 and r103 are each an integer of 0 to 4;
when r101 is 2 or greater, the two or more R101s are the same as or different from each other;
when r102 is 2 or greater, the two or more R102s are the same as or different from each other;
when r103 is 2 or greater, the two or more R103s are the same as or different from each other;
when a is 2 or greater, the two or more structures in the parentheses are the same as or different from each other;
when b is 2 or greater, the two or more structures in the parentheses are the same as or different from each other; and
when c is 2 or greater, the two or more structures in the parentheses are the same as or different from each other.

4. The heterocyclic compound of claim 1, wherein at least one of R1 to R12 is the group of Chemical Formula 2, and the rest are the same as or different from each other, and each independently is hydrogen, a cycloalkyl group, an arylphosphine oxide group, an aryl group that is unsubstituted or substituted with a cyano group or an alkyl group substituted with a halogen group, or a heteroaryl group, or adjacent groups bond to each other to form an aromatic hydrocarbon ring that is unsubstituted or substituted with an aryl group, or a heteroring.

5. The heterocyclic compound of claim 1, wherein L1 is a direct bond, an arylene group, or a heteroarylene group.

6. The heterocyclic compound of claim 1, wherein A1 is O and one of Ar1 and Ar2 is an alkyl group, and the other is an aryl group that is unsubstituted or substituted with an alkyl group or an aryl group, or is a heteroaryl group.

7. The heterocyclic compound of claim 1, wherein Chemical Formula 1 is selected from among the following compounds:

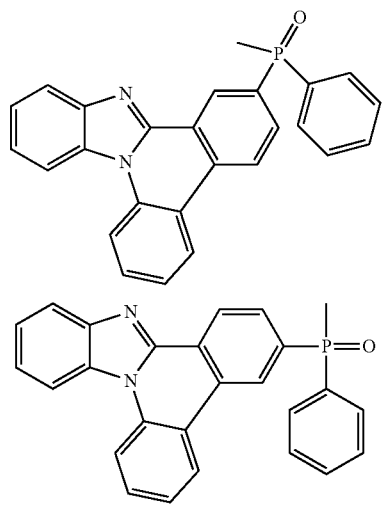

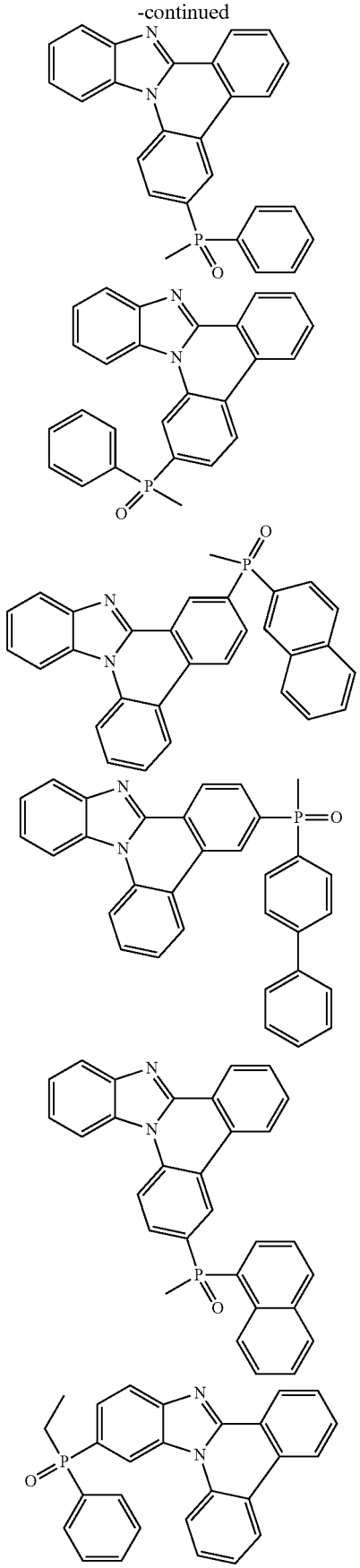
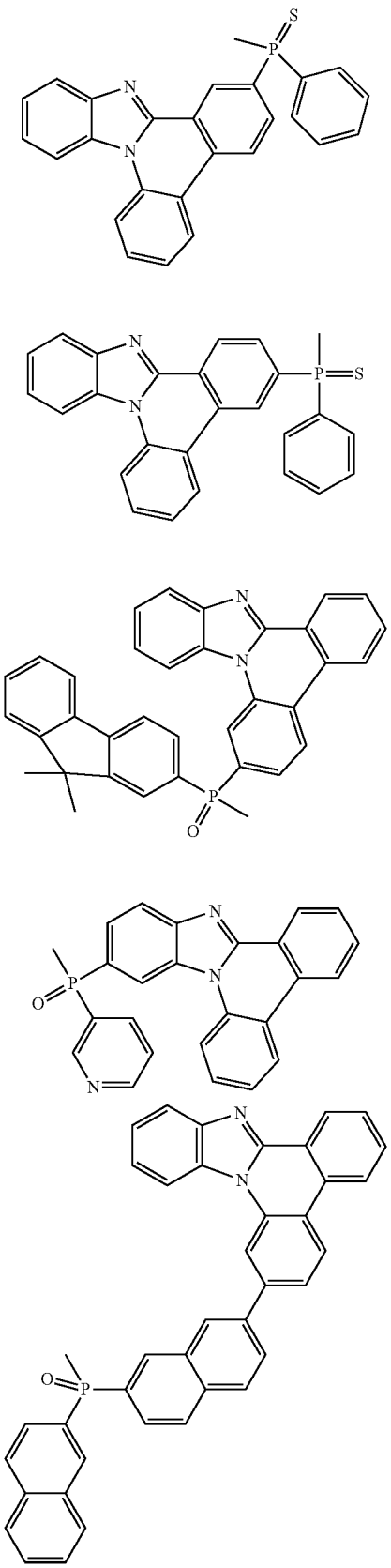

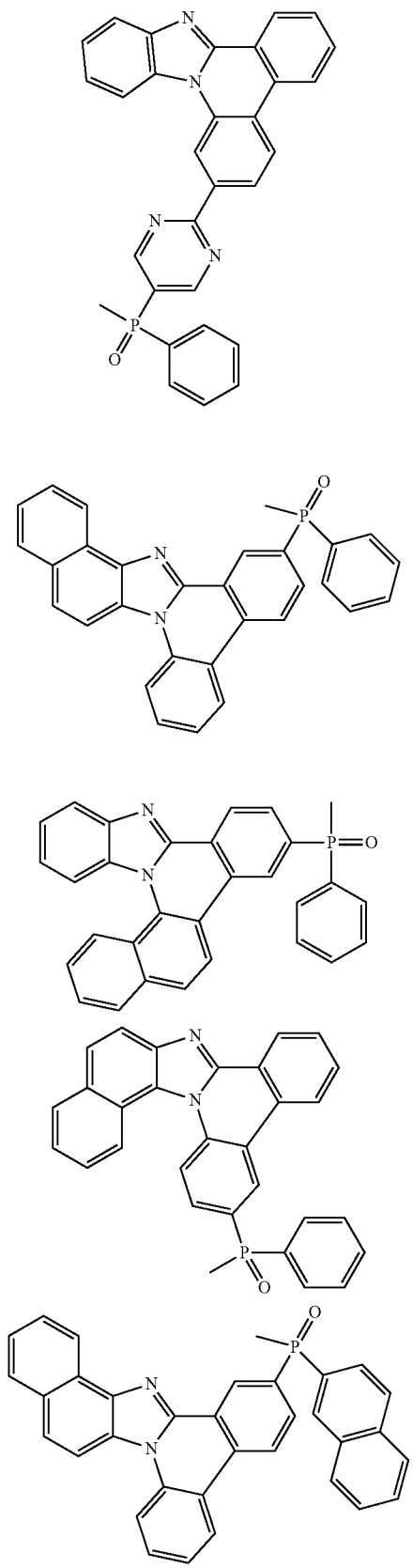
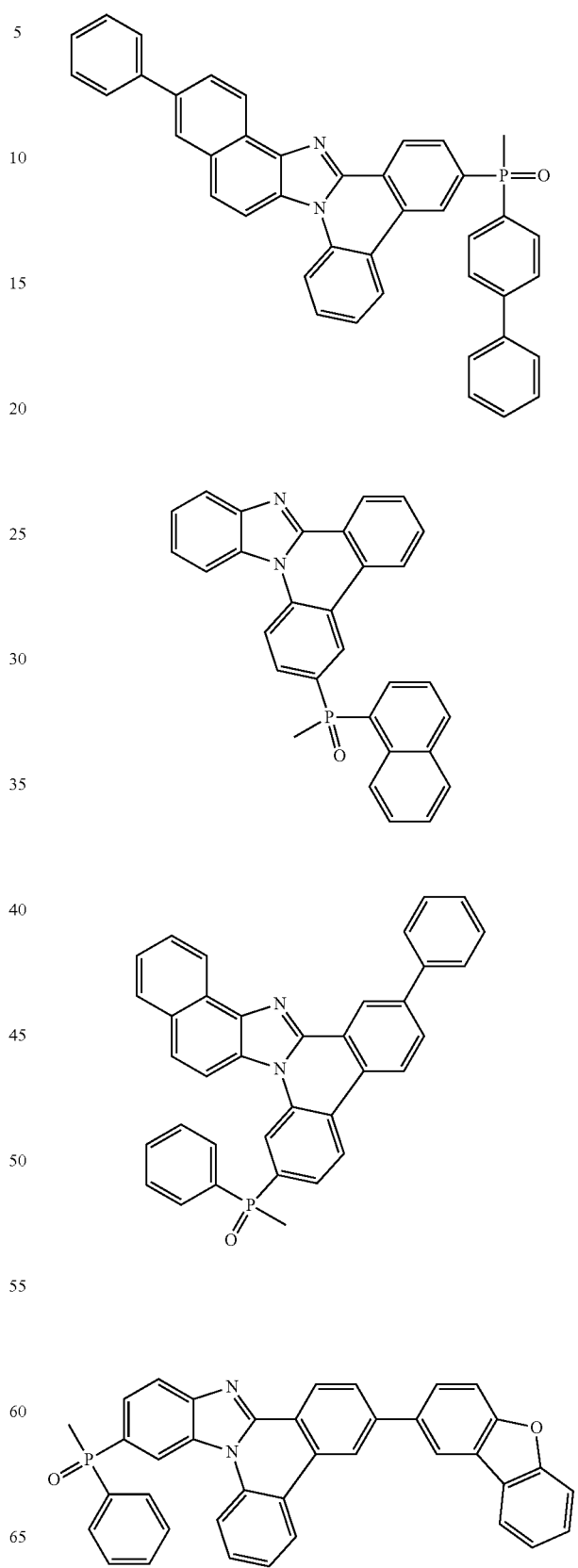

-continued

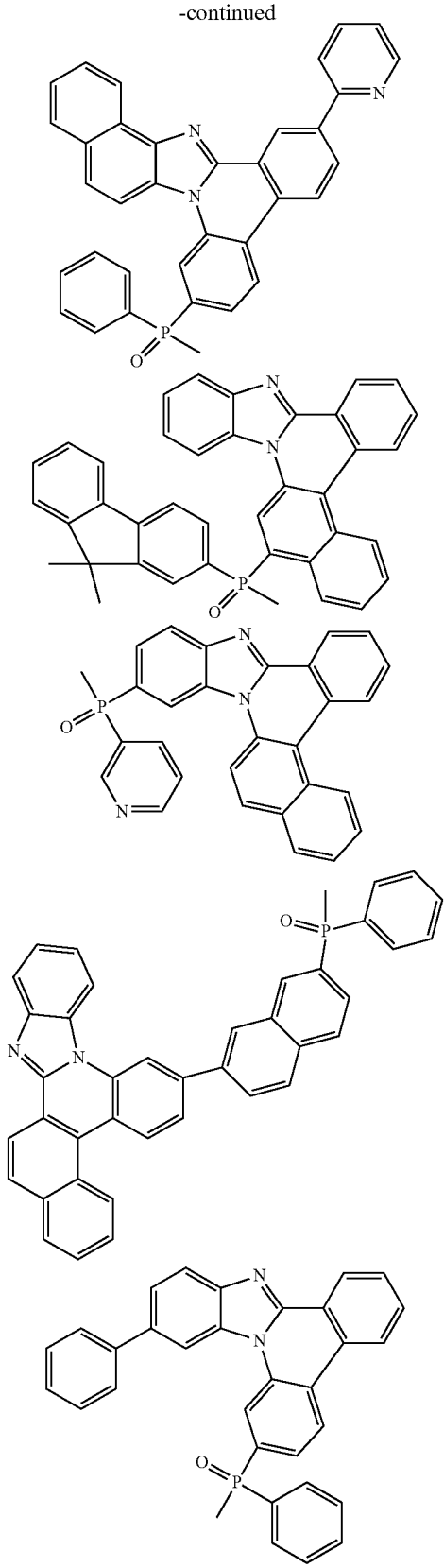

-continued

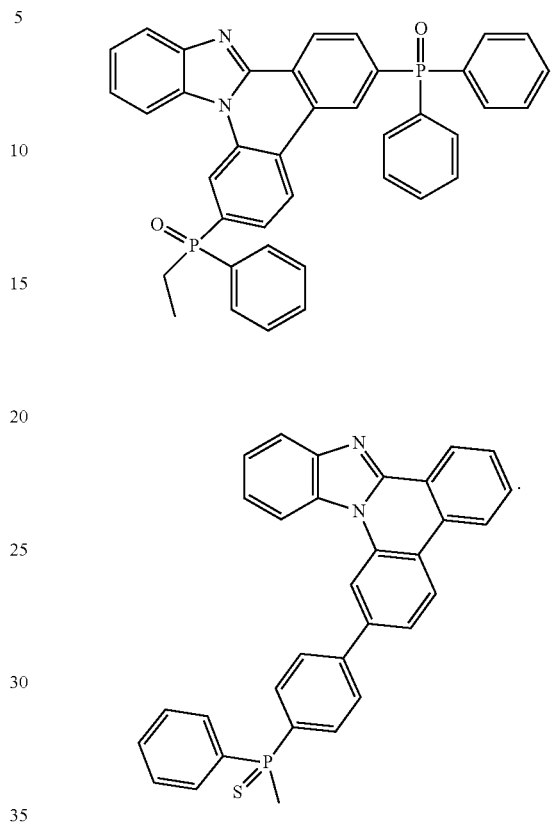

8. An organic light emitting device comprising:
a first electrode;
a second electrode provided opposite to the first electrode; and
one or more organic material layers provided between the first electrode and the second electrode,
wherein one or more layers of the organic material layers comprise the heterocyclic compound of claim 1.

9. The organic light emitting device of claim 8, wherein the organic material layers comprise an electron injection layer, an electron transfer layer, or a layer carrying out electron injection and transfer at the same time, and the electron injection layer, the electron transfer layer, or the layer carrying out electron injection and transfer at the same time comprises the heterocyclic compound.

10. The organic light emitting device of claim 8, wherein the organic material layers comprise a hole blocking layer, and the hole blocking layer comprises the heterocyclic compound.

11. The organic light emitting device of claim 8, wherein the organic material layers comprise an electron control layer, and the electron control layer comprises the heterocyclic compound.

* * * * *